(12) United States Patent
Sasaki et al.

(10) Patent No.: US 8,253,481 B2
(45) Date of Patent: *Aug. 28, 2012

(54) SEMICONDUCTOR INTEGRATED CIRCUIT DEVICE

(75) Inventors: Toshio Sasaki, Tokyo (JP); Kazuki Fukuoka, Tokyo (JP); Ryo Mori, Tokyo (JP); Yoshihiko Yasu, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/244,553

(22) Filed: Sep. 25, 2011

(65) Prior Publication Data

US 2012/0013382 A1    Jan. 19, 2012

Related U.S. Application Data

(63) Continuation of application No. 12/608,105, filed on Oct. 29, 2009, now Pat. No. 8,044,709.

(30) Foreign Application Priority Data

Nov. 14, 2008    (JP) ................................. 2008-291929

(51) Int. Cl.
   *G05F 1/10*    (2006.01)
(52) U.S. Cl. ......................................... 327/544; 326/33
(58) Field of Classification Search .................. 327/544; 326/31, 33, 34
See application file for complete search history.

(56) References Cited

U.S. PATENT DOCUMENTS

| | | | |
|---|---|---|---|
| 5,583,457 A | 12/1996 | Horiguchi et al. | |
| 5,687,123 A | 11/1997 | Hidaka et al. | |
| 6,140,864 A | 10/2000 | Hirata et al. | |
| 6,292,015 B1 | 9/2001 | Ooishi et al. | |
| 6,313,695 B1 | 11/2001 | Ooishi et al. | |
| 6,411,149 B1 | 6/2002 | Ooishi | |
| 6,888,395 B2 | 5/2005 | Mizuno et al. | |
| 7,042,245 B2 | 5/2006 | Hidaka | |
| 7,251,170 B2 | 7/2007 | Lee et al. | |
| 7,265,605 B1* | 9/2007 | Vasudevan | 327/534 |
| 7,479,801 B2 | 1/2009 | Bhattacharya | |
| 7,639,068 B2 | 12/2009 | Mizuno et al. | |
| 7,825,720 B2* | 11/2010 | Ramaraju et al. | 327/543 |
| 8,044,709 B2* | 10/2011 | Sasaki et al. | 327/544 |
| 2007/0069807 A1* | 3/2007 | Ho | 327/541 |
| 2008/0116956 A1 | 5/2008 | Teramoto et al. | |
| 2010/0109764 A1 | 5/2010 | Dathe et al. | |

FOREIGN PATENT DOCUMENTS

JP    10-125878 A    5/1998

* cited by examiner

*Primary Examiner* — Thomas J Hiltunen
(74) *Attorney, Agent, or Firm* — Miles & Stockbridge P.C.

(57) ABSTRACT

The present invention is directed to perform fine low-voltage control without largely increasing the circuit layout area in a low-power consumption structure. In the case of shifting a region to a low-speed mode, a system controller outputs a request signal and an enable signal to a power switch controller and a low-power drive circuit, respectively, to turn off a power switch and to perform a control so that the voltage level of a virtual reference potential becomes about 0.2 V to about 0.3V. The region operates on voltages between a power supply voltage and a virtual reference potential, so that it is controlled in the low-speed mode.

16 Claims, 18 Drawing Sheets

LOW-POWER DRIVE CIRCUIT

SEMICONDUCTOR INTEGRATED CIRCUIT DEVICE

CROSS-REFERENCE TO RELATED APPLICATIONS

This application is a continuation of application Ser. No. 12/608,105 filed Oct. 29, 2009 (now U.S. Pat. No. 8,044,709). The disclosure of Japanese Patent Application No. 2008-291929 filed on Nov. 14, 2008 including the specification, drawings and abstract is incorporated hereby reference in its entirety.

BACKGROUND OF THE INVENTION

The present invention relates to a technique for lowering power consumption of a semiconductor integrated circuit device and, more particularly, to a technique effective to high-precision reduction of power consumption in a semiconductor integrated circuit device having a plurality of power supply regions in which low-power-consumption control is performed.

In recent years, a demand for lower power consumption is increasing. As a technique for reducing power consumption, for example, there is known a technique of dividing a core power region (for example, by logic blocks), controlling the on/off state of a power supply by the divided regions and, in the case of a low-speed operation or the like, controlling a power supply voltage VDD to reduce power consumption.

In the consumption power reducing technique, for example, an operating state of a semiconductor integrated circuit device is determined by a control of software, and on/off control on the core power region is controlled by a system controller or the like which controls the semiconductor integrated circuit device. The power supply voltage to be controlled is supplied from the outside of a semiconductor integrated circuit device.

In a technique of reducing power consumption in a semiconductor integrated circuit device of this kind, for example, a basic cell is used in which two low-threshold p-channel MOS transistors provided in the lateral direction and two low-threshold n-channel MOS transistors provided in the lateral direction are disposed in the vertical direction, a high-threshold p-channel MOS transistor is disposed on the upper side adjacent to the p-channel MOS transistors and a high-threshold n-channel MOS transistor is disposed on the lower side adjacent to the low-threshold n-channel MOS transistors (refer to, for example, patent document 1 (Japanese Patent Laid-open No. Hei 10 (1998)-125878).

SUMMARY OF THE INVENTION

However, the inventors of the present invention have found the following problems in the technique for reducing power consumption in a semiconductor integrated circuit device.

Since the power supply voltages supplied to cores are different from each other depending on operation speeds required and the like, it is desirable to supply power supply voltages at a plurality of voltage levels in a low-speed operation mode. In this case, a plurality of power supply wires for supplying the power supply voltages are required for the different power supply voltages, so that the layout area increases. Moreover, the resistance in a wiring network becomes high, and there is a possibility that a power supply voltage drop or the like occurs.

An object of the present invention is to provide a technique capable of fine low-voltage control without largely increasing a circuit layout area in a structure for reducing power consumption.

The above and other objects and novel features of the present invention will become apparent from the description of the specification and the appended drawings.

Outline of representative inventions disclosed in the present application will be briefly described as follows.

A semiconductor integrated circuit device as an embodiment of the present invention includes: a first power wire to which a power supply voltage is supplied; a second power wire to which a reference voltage is supplied; a third power wire to which a reference potential is supplied; power regions coupled between the first and second power wires and controlled in different low-power-consumption modes; a reference voltage regulator for supplying the reference voltage to the second power wire on the basis of a control signal; a power switch control unit coupled between the second and third power wires and making the second and third power wires conductive or non-conductive in accordance with a control signal; and a power consumption control unit for determining an operation state of each of the power regions and controlling the reference voltage regulator and the power switch control unit. In a low-speed mode as one of the low-power-consumption modes, the power consumption control unit controls so that the reference voltage regulator supplies the reference voltage to the second power wire and controls so that the power switch control unit makes the second and third power wires non-conductive to make an arbitrary power region which is in the low-speed mode operate between the power supply voltage supplied to the first power wire and the reference voltage supplied to the second power wire. In a standby mode as one of the low-power-consumption modes, the power consumption control unit controls so as to stop the operation of the reference voltage regulator, and controls so that the power switch control unit makes the second and third power wires non-conductive to interrupt supply of the power supply voltage to an arbitrary power region which is in the standby mode. In a normal operation mode, the power consumption control unit stops the operation of the reference voltage regulator, controls so that the power switch control unit makes the second and third power wires non-conductive, and makes an arbitrary power region which is in the normal operation mode operate between the power supply voltage supplied to the first power wire and the reference potential supplied to the third power wire.

A semiconductor integrated circuit device as another embodiment of the invention includes: a first power wire to which a power supply voltage is supplied; a second power wire to which a reference voltage is supplied; a third power wire to which a reference potential is supplied; power regions coupled between the first and second power wires and controlled in different low-power-consumption modes; a reference voltage regulator for supplying the reference voltage to the second power wire on the basis of a control signal; a power switch control unit coupled between the second and third power wires and making the second and third power wires conductive or non-conductive or setting the reference voltage in accordance with a control signal; and a power consumption control unit for determining an operation state of each of the power regions and controlling the reference voltage regulator and the power switch control unit. In a low-speed mode as one of the low-power-consumption modes, the power consumption control unit controls so that the reference voltage regulator controls a gate of a power switch to supply the reference voltage to the second power wire, controls so that the power switch control unit makes the second and third power wires non-conductive, makes an arbitrary power region which is in the low-speed mode operate between the power supply voltage supplied to the first power wire and the reference voltage supplied to the second power wire. In a standby mode as one of the low-power-consumption modes, the power consumption control unit controls so as to stop the operation of the reference voltage regulator, controls so that the power switch control unit makes the second and third power wires non-conductive, and interrupts supply of the power supply voltage to an arbitrary power region which is in the standby mode. In a normal operation mode, the power consumption control unit stops the operation of the reference voltage regulator, controls so that the power switch control unit makes the second and third power wires conductive, and makes an arbitrary power region which is in the normal operation mode operate between the power supply voltage supplied to the first power wire and the reference potential supplied to the third power wire.

A semiconductor integrated circuit device as further another embodiment of the invention includes: a first power wire to which a power supply voltage is supplied; a second power wire to which a reference voltage is supplied; a third power wire to which a reference potential is supplied; power regions coupled between the first and second power wires and controlled in different low-power-consumption modes; a power switch control unit coupled between the second and third power wires and making the second and third power wires conductive or non-conductive in accordance with a control signal; and a power consumption control unit for determining an operation state of each of the power regions and controlling the power switch control unit and a reference voltage regulator which is externally coupled and supplies the reference voltage to the second power wire on the basis of a control signal. In a low-speed mode as one of the low-power-consumption modes, the power consumption control unit controls so that the reference voltage regulator controls a gate of a power switch, controls to supply the reference voltage to the second power wire, controls so that the power switch control unit makes the second and third power wires non-conductive, and makes an arbitrary power region which is in the low-speed mode operate between the power supply voltage supplied to the first power wire and the reference voltage supplied to the second power wire In a standby mode as one of the low-power-consumption modes, the power consumption control unit controls so as to stop the operation of the reference voltage regulator, controls so that the power switch control unit makes the second and third power wires non-conductive, and interrupts supply of the power supply voltage to an arbitrary power region which is in the standby mode. In a normal operation mode, the power consumption control unit stops the operation of the reference voltage regulator, controls so that the power switch control unit makes the second and third power wires conductive, and makes an arbitrary power region which is in the normal operation mode operate between the power supply voltage supplied to the first power wire and the reference potential supplied to the third power wire.

Outline of other inventions in the application will be briefly described.

In any of the semiconductor integrated circuit devices according to the present invention, the power switch control unit includes a switch unit made by a plurality of transistors coupled between the second and third power wires, and a switch control unit for controlling operation of the switch unit. The switch control unit includes a logic unit for generating a switch control signal on the basis of a control signal output from the power consumption control unit, and an inverter unit for generating a drive control signal for controlling operation of the switch unit on the basis of the switch control signal output from the logic unit. The inverter unit includes a first transistor for driving a high power made by P-channel MOS, a second transistor for driving a low power made by P-channel MOS, and a third transistor made by N-channel MOS, the first and second transistors which are coupled in parallel being coupled to the third transistor in series. When the power consumption control unit outputs a control signal for resetting the mode from the standby mode to the normal operation mode, the logic unit performs a control of driving the second transistor for an arbitrary period and, after that, driving the first transistor.

In any of the semiconductor integrated circuit devices according to the invention, the semiconductor integrated circuit device has a system-in-package configuration in which at least two semiconductor chips are mounted, and the reference voltage regulator is configured by a single semiconductor chip.

Further, in any of the semiconductor integrated circuit devices according to the invention, the reference voltage generated by the reference voltage regulator is supplied to the second power wire via a power bus formed on the outside of a semiconductor chip.

An effect obtained by the representative ones of the inventions disclosed in the application will be briefly described as follows.
(1) A high-precision low-power-consumption control can be performed on the power region unit basis.
(2) Reset from the low-speed mode in a power region to the normal operation mode can be performed at higher speed.
(3) From the above points (1) and (2), without deteriorating the performance in a semiconductor integrated circuit device, optimum reduction in power consumption can be realized.

DETAILED DESCRIPTION OF THE PREFERRED EMBODIMENTS

1. Outline of Embodiment

Figure 1:
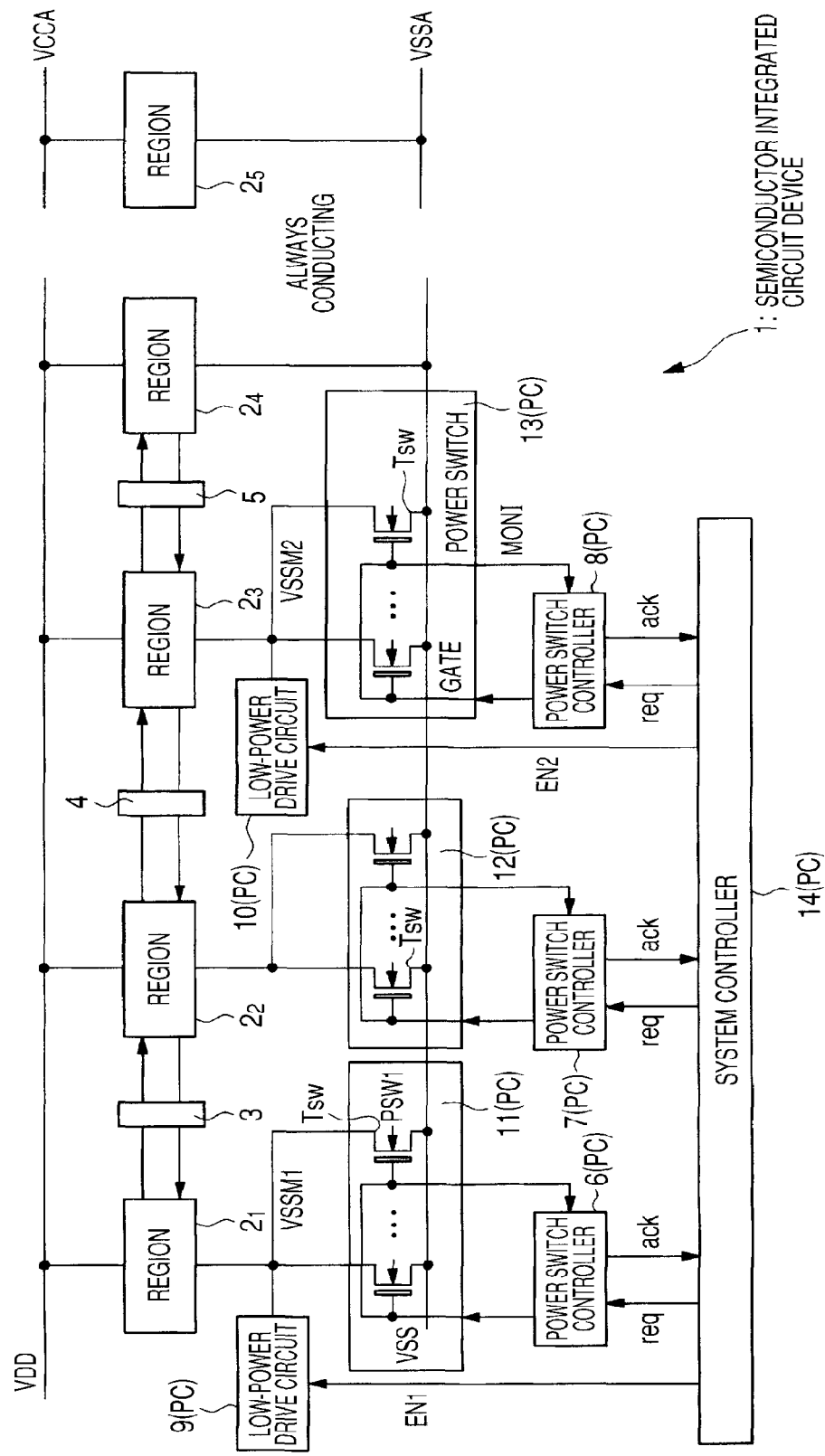
FIG. 1 is an explanatory diagram showing a configuration example of a semiconductor integrated circuit device according to a first embodiment of the present invention.

Embodiments of the present invention will be described in detail hereinbelow. In all of the diagrams for explaining the embodiments, as a rule, the same reference numerals are designated to the same members and their repetitive explanation will not be given.

First Embodiment

Figure 2:
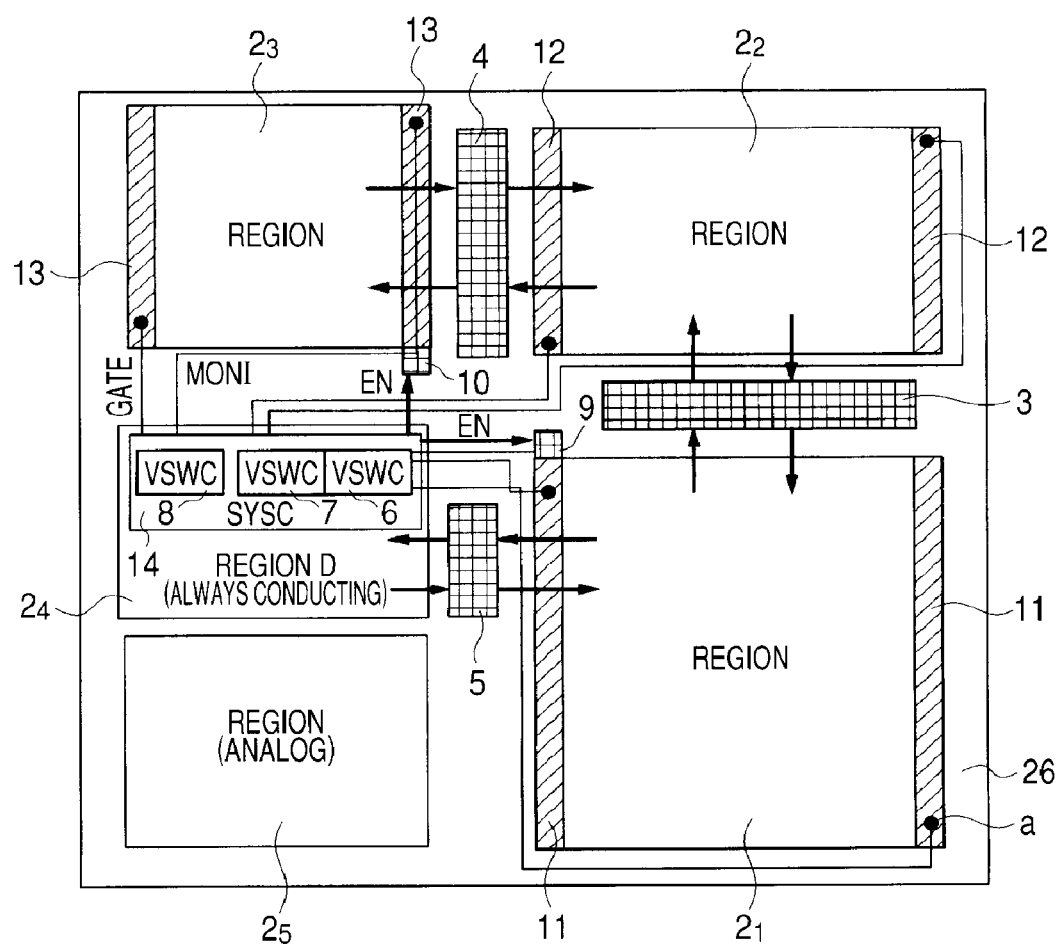
FIG. 2 is a layout diagram showing an example of a chip layout of the semiconductor integrated circuit device of FIG. 1.
Figure 3A:
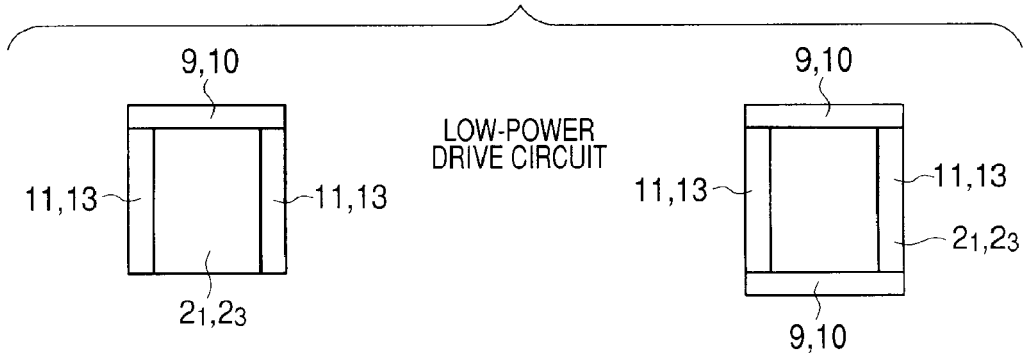
FIGS. 3A to 3D are explanatory diagrams showing layout examples in a low-power drive circuit provided for the semiconductor integrated circuit device of FIG. 1.
Figure 3B:
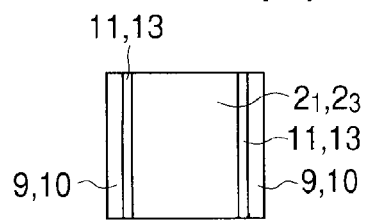
Figure 4:
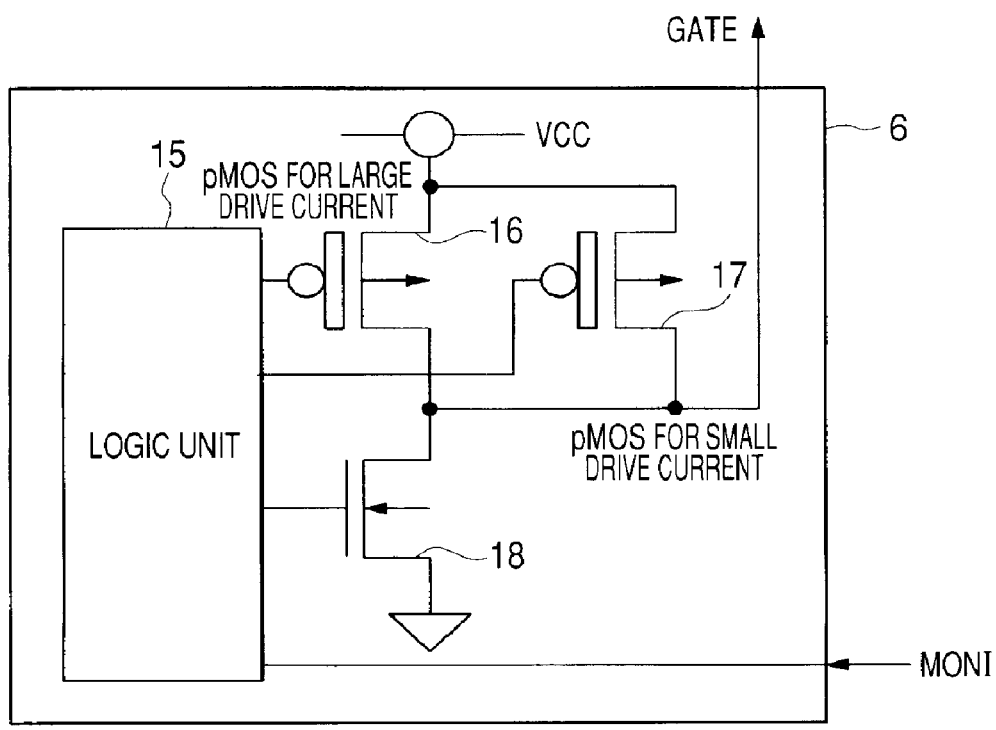
FIG. 4 is an explanatory diagram showing the configuration of a power switch controller provided for the semiconductor integrated circuit device of FIG. 1.
Figure 5:
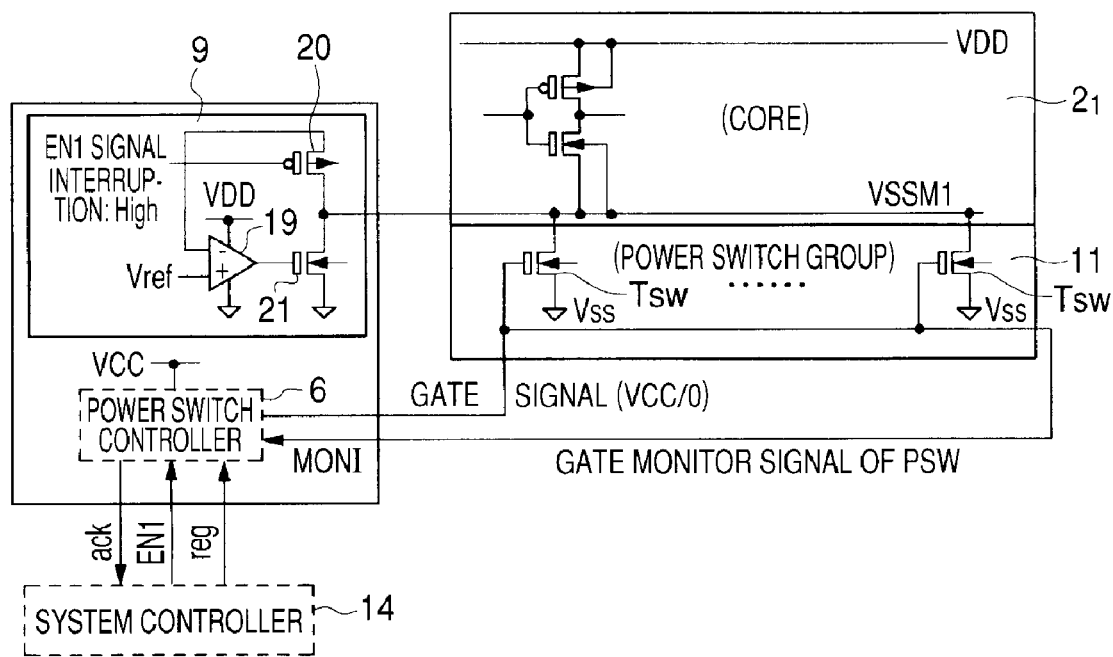
FIG. 5 is an explanatory diagram showing an example of voltage control of a virtual reference potential by the power switch controller and the low-power drive circuit provided for the semiconductor integrated circuit device of FIG. 1.
Figure 6:
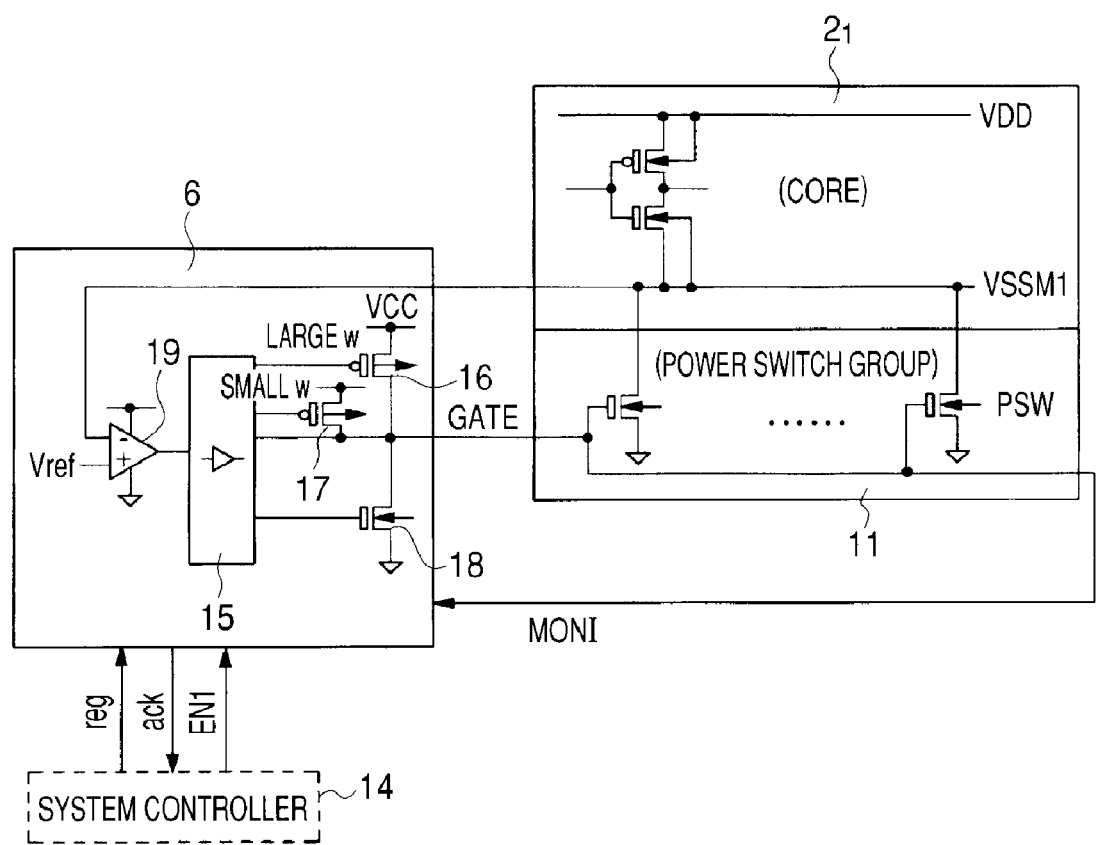
FIG. 6 is an explanatory diagram showing another configuration example of the power switch controller according to the first embodiment of the invention.
Figure 7:
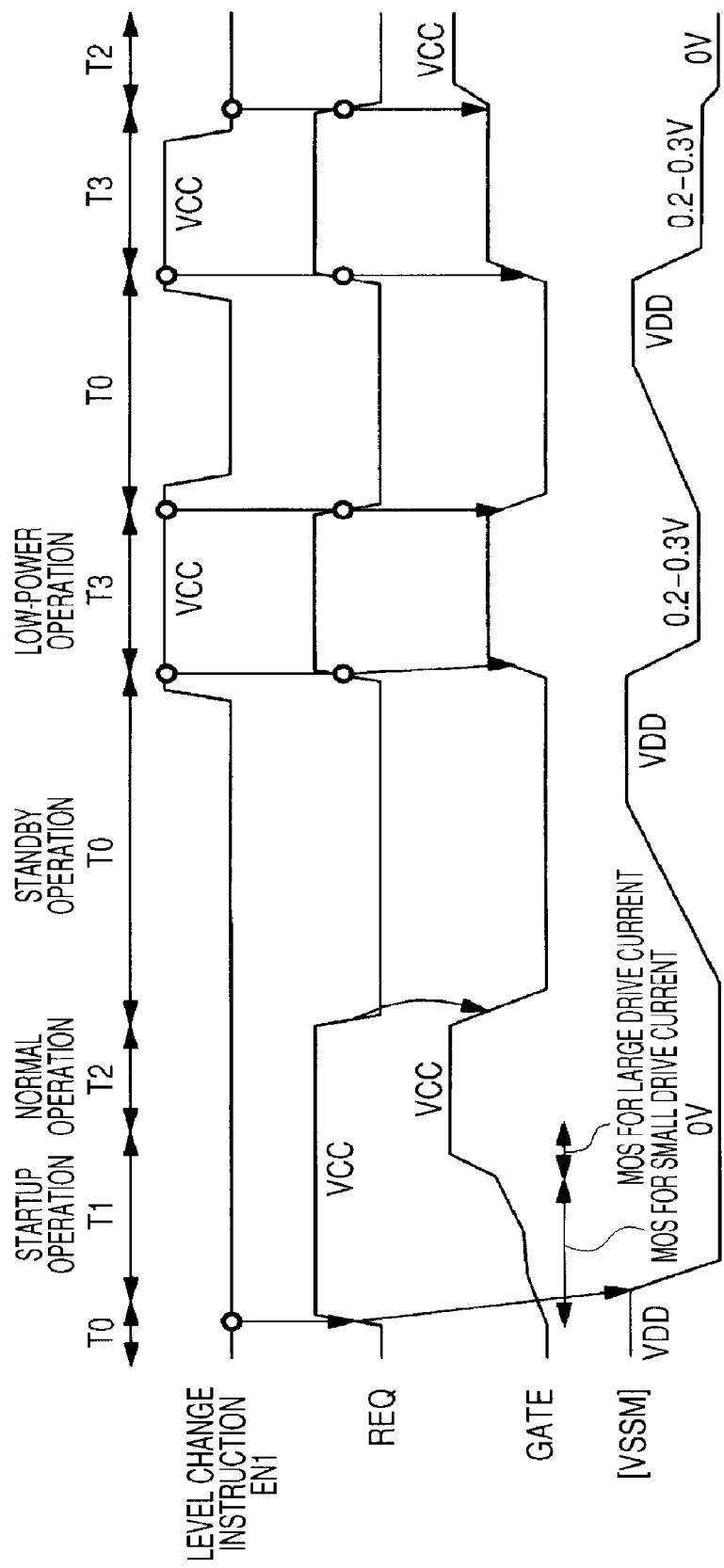
FIG. 7 is a timing chart showing an operation example of a power shutdown control unit provided for the semiconductor integrated circuit device of FIG. 1.

FIG. 1 is an explanatory diagram showing a configuration example of a semiconductor integrated circuit device according to a first embodiment of the present invention. FIG. 2 is a layout diagram showing an example of a chip layout of the semiconductor integrated circuit device of FIG. 1. FIGS. 3A to 3D are explanatory diagrams showing layout examples in a low-power drive circuit provided for the semiconductor integrated circuit device of FIG. 1. FIG. 4 is an explanatory diagram showing the configuration of a power switch controller provided for the semiconductor integrated circuit device of FIG. 1. FIG. 5 is an explanatory diagram showing an example of voltage control of a virtual reference potential by the power switch controller and the low-power drive circuit provided for the semiconductor integrated circuit device of FIG. 1. FIG. 6 is an explanatory diagram showing another configuration example of the power switch controller according to the first embodiment of the invention. FIG. 7 is a timing chart showing an operation example of a power shutdown control unit provided for the semiconductor integrated circuit device of FIG. 1.

In the first embodiment, a semiconductor integrated circuit device 1 includes, as shown in FIG. 1, regions $2_1$ to $2_5$ as power supply regions, indefiniteness propagation preventing circuits 3 to 5, power switch controllers 6 to 8, low-power drive circuits 9 and 10, power switches 11 to 13, and a system controller 14.

The regions $2_1$ to $2_5$ are, for example, regions by function blocks. For example, the regions $2_1$ to $2_3$ are made by a CPU (Central Processing Unit), a DSP (Digital Signal Processor), a RAM (Random Access Memory), and the like. The region $2_4$ is, for example, a logic circuit region of a clock system, and the region $2_5$ is configured by an analog circuit or the like. The regions $2_4$ and $2_5$ are regions in which the low-power-consumption control is not performed and to which the power supply voltage is constantly supplied.

The regions $2_1$ and $2_2$ are coupled to each other via the indefiniteness propagation preventing circuit 3, the regions $2_2$ and $2_3$ are coupled to each other via the indefiniteness propagation preventing circuit 4, and the regions $2_3$ and $2_4$ are coupled to each other via the indefiniteness propagation preventing circuit 5. To the regions $2_1$ to $2_4$, a power supply voltage VDD is coupled so as to be supplied. The region $2_5$ is coupled between an analog power supply voltage VCCA and an analog reference potential VSSA.

A power shutdown control unit PC is configured by the power switch controllers 6 to 8 for performing power switch control, the low-power drive circuits 9 and 10 as regulators for reference voltage, the power switches 11 to 13 for performing power switch control, and the system controller 14 as a power consumption control unit.

The power switch 11 is coupled between the region $2_1$ and a reference potential VSS, the power switch 12 is coupled between the region $2_2$ and the reference potential VSS, and the power switch 13 is coupled between the region $2_3$ and the reference potential VSS.

Further, the low-power drive circuit 9 is coupled to the coupling part between the power switch 11 and the region $2_1$, and the coupling point becomes a virtual reference potential VSSM1. The low-power drive circuit 10 is coupled to the coupling part between the power switch 12 and the region $2_2$, and the coupling point becomes a virtual reference potential VSSM2.

The low-power drive circuit 9 controls the voltage level of the virtual reference potential VSSM1 on the basis of an enable signal EN1 output from the system controller 14. The low-power drive circuit 10 controls the voltage level of the virtual reference potential VSSM2 on the basis of an enable signal EN2 output from the system controller 14.

Each of the power switches 11 to 13 is configured by, for example, coupling a plurality of N-channel MOS (Metal Oxide Semiconductor) transistors in parallel. The power switch controller 6 controls the on (conductive) or off (non-conductive) operation of the power switch 11. The power switch controller 7 controls the on/off operation of the power switch 12, and the power switch controller 8 controls the on/off operation of the power switch 13.

The system controller 14 is coupled to the power switch controllers 6 to 8 and the low-power drive circuits 9 and 10. The power switch controllers 6 to 8 and the low-power drive circuits 9 and 10 operate on the basis of the control of the system controller 14. The system controller 14 controls the operation of the semiconductor integrated circuit device 1.

In the semiconductor integrated circuit device 1, by turning on/off the power switches 11 to 13 provided between the regions $2_1$ to $2_3$ and the reference potential VSS, internal power shutdown is performed, thereby reducing leak current (sub-threshold leak, gate tunnel leak, GIDL (Gate Induced Drain Leakage) or the like) in a standby mode.

On receipt of a request signal REQ output from the system controller 14, the power switch controllers 6 to 8 performs the on/off control on the power switches. On completion of on control process, the power switch controllers 6 to 8 outputs a power recovery completion signal ack to the system controller 14.

As necessary, a level shifter is inserted between the system controller 14 and the power switch controllers 6 to 8. The level shifter performs power supply voltage VCC-to-power supply voltage VDD conversion.

When the power shutdown is carried out under the low-power-consumption control, all of output signals from the power-off regions become indefinite. Consequently, the signal levels are fixed in the indefiniteness propagation preventing circuits 3 to 5 by a control signal from the system controller 14 to prevent erroneous operation caused by indefiniteness propagation to power-on regions.

As described above, the power shutdown of the semiconductor integrated circuit device 1 is performed by function blocks (regions $2_1$ to $2_3$), and the power supply shutdown/recover is carried out by handshake with the system controller 14.

Further, the voltage levels of the virtual reference potentials VSSM1 and VSSM2 are controlled by the low-power drive circuits 9 and 10, respectively, so that the voltage level of the virtual reference potential according to the operation mode of the semiconductor integrated circuit device 1 is controlled by an instruction of the system controller 14.

For example, the CPU, the DSP, and the like are used at high speed in a normal operation mode. In the case of shifting to the standby mode or low-speed mode, an arbitrary voltage becoming reference voltage is applied to the virtual reference potentials VSSM1 and VSSM2 by the low-power drive circuits 9 and 10.

Since procedure time is necessary for the recovery process at the time of shifting to a high-speed mode from the standby mode in which the power is shut down by the power switch, it is also effective to additionally apply the low-power drive circuit to a region which is desired to be recovered promptly to the high-speed operation.

FIG. 2 is a layout diagram showing an example of a chip layout in the semiconductor integrated circuit device of FIG. 1.

In FIG. 2, the region $2_3$ is disposed in a left upper part in a semiconductor chip 26, and the region $2_2$ is disposed in a right upper part in the semiconductor chip 26. Between the regions $2_3$ and $2_2$, the indefiniteness propagation preventing circuit 5 is disposed.

The indefiniteness propagation preventing circuit 3 is disposed below the region $2_2$, and the region $2_1$ is disposed below the indefiniteness propagation preventing circuit 3. The region $2_4$ is disposed below the region $2_3$, and the region $2_5$ is disposed below the region $2_4$. The indefiniteness propagation preventing circuit 5 is disposed between the regions $2_4$ and $2_1$.

The power switches 13 are disposed on both sides of the region $2_3$, and the power switches 12 are disposed on both sides of the region $2_2$. The power switches 11 are disposed on both sides of the region $2_1$.

The system controller 14 is disposed in an upper part of the region $2_4$, and the power switch controllers 6 to 8 are disposed in the system controller 14.

The low-power drive circuit 10 is disposed below the power switch 13 disposed on the right side of the region $2_3$, and the low-power drive circuit 9 is disposed above the power switch 13 disposed on the left side of the region $2_1$.

FIGS. 3A to 3D are explanatory diagrams illustrating layout examples in the low-power drive circuit 9 (10).

The layout of the low-power drive circuit 9 (10) is not limited to the layout shown in FIG. 2. For example, the low-power drive circuit 9 (10) may be disposed on the region $2_1$ ($2_3$) or on and below the region $2_1$ ($2_3$) as shown in FIG. 3A or disposed on both sides of the power switch 11 (13) disposed on both sides of the region $2_1$ ($2_3$) as shown in FIG. 3B.

Figure 3C:
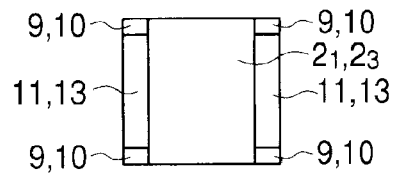
Figure 3D:
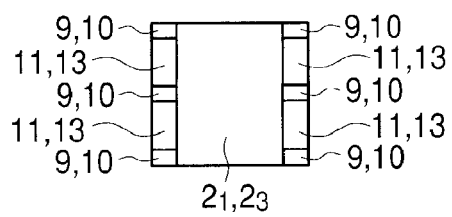

Further, the low-power drive circuits 9 (10) may be disposed at four corners of the region $2_1$ ($2_3$) as shown in FIG. 3C or disposed in layout regions of the power switches 11 (13) disposed on both sides of the region $2_1$ ($2_3$) as shown in FIG. 3D.

In the case of disposing the low-power drive circuits 9 (10) at four corners of the region $2_1$ ($2_3$) as shown in FIG. 3C, the four low-power drive circuits 9 (10) may be driven or arbitrary one(s) of the four low-power drive circuits 9 (10) may be driven depending on the ability of the low-power drive circuits 9 (10).

The configuration of the power switch controller 6 will be described with reference to FIG. 4.

As shown in the diagram, the power switch controller 6 includes a logic unit 15 and transistors 16 to 18. The logic unit 15 controls the operation of the transistors 16 to 18 on the basis of the request signal REQ of the system controller 14.

The transistors 16 and 17 are made of P-channel MOS. The transistor 16 as a first transistor is a transistor for large drive current. The transistor 17 as a second transistor is a transistor for small drive current. The transistor 18 is made of N-channel MOS.

The power supply voltage VCC is supplied to one of coupling parts of each of the transistors 16 and 17. One of connection parts of the transistor 18 is coupled to the other coupling part of each of the transistors 16 and 17. The reference potential VSS is supplied to the other coupling part of the transistor 18.

The transistors 16 to 18 have an inverter configuration. The coupling part between the transistors 16 and 17 and the transistor 18 is an output part. From the output part, a gate signal GATE is output to the power switch 11.

A monitor signal MONI is supplied to the logic unit 15. The monitor signal MONI is a gate potential monitor signal of a transistor (node "a" in FIG. 2) as a component of the power switch 11 which is the furthest from the power switch controller 6.

The logic unit 15 enables the gate potential of the power switch 11 to be monitored in response to the monitor signal MONI. At the time of recovering the power, the logic unit 15 suppresses inrush current (since charges in the nF order are accumulated, large current flows between the virtual reference potential VSSM and the reference potential VSS) by driving the transistor 17 for driving small current and, after that, switches to turn on the transistor 16 for driving large current. After that, the logic unit 15 detects the potential of the monitor signal MONI (for example, the power supply voltage VCC×about 90% of the power, and outputs the power recovery completion signal ack (for example, active Hi) to the system controller 14.

Referring to FIG. 4, the configuration of the power switch controller 6 has been described. The power switch controllers 7 and 8 have a similar configuration.

FIG. 5 is an explanatory diagram showing an example of controlling the voltage of the virtual reference potential VSSM.

The diagram shows an example paying attention to the region $2_1$, the power switch controller 6, the low-power drive circuit 9, and the power switch unit 11 in the semiconductor integrated circuit device 1 (FIG. 1). An operation in the region $2_3$, the power switch controller 8, the low-power drive circuit 10, and the power switch unit 13 is also similar to the above.

The low-power drive circuit 9 includes a regulator comprised of an operational amplifier 19 and transistors 20 and 21. The negative (−) side input terminal of the operational amplifier 19 is coupled to one of input parts of the transistor 20 made of p-channel MOS, and a reference voltage Vref is supplied to the positive (+) side input terminal of the operational amplifier 19.

The enable signal EN1 from the system controller 14 is input to the gate of the transistor 20, and one of coupling parts of the transistor 21 made of N-channel MOS is coupled to the other coupling part of the transistor 20.

The output part of the operational amplifier 19 is coupled to the gate of the transistor 21, and the reference potential VSS is coupled to the other connection part of the transistor 21. In the connection part of the transistors 20 and 21, the virtual reference potential VSSM1 is obtained.

To the virtual reference potential VSSM1, the region $2_1$ and one of the connection parts of each of a plurality of transistors Tsw configuring the power switch 11 are coupled. The reference potential VSS is coupled to the other connection part of each of the transistors Tsw. The gate signal GATE output from the power switch controller 6 is supplied to the gate of the transistor Tsw.

In FIG. 5, when the enable signal EN1 is at the low level, the power switch controller 6 outputs a low-level signal (power-off operation). The voltage level of the virtual reference potential VSSM1 is controlled to be a low voltage of, for example, about 0.2V to 0.3V by the operational amplifier 19. The region $2_1$ is controlled in the low-speed mode (low-power-consumption mode).

When the enable signal EN1 becomes a high-level signal, the virtual reference potential VSSM1 becomes open, the gate signal GATE output from the power switch controller 6 becomes a high-level signal (=power supply voltage VCC), and the virtual reference potential VSSM1 is controlled to a low-level signal (=reference potential VSS).

As described above, in the normal operation mode, the power shutdown control unit PC makes the power switch 11 conductive, and sets the voltage level of the virtual reference potential VSSM1 to the reference potential VSS. In the low-speed mode, the power shutdown control unit PC makes the power switch 11 conductive, and sets the virtual reference potential VSSM1 to the low voltage level (about 0.2V to 0.3V).

In the standby mode, the power shutdown control unit PC makes the power switch 11 nonconductive and sets the voltage level of the virtual reference potential VSSM1 to the floating state.

Usually, recovery from the standby mode to the normal operation mode needs the order of μsec. In the low-speed mode, the power supply potential is lowered to a certain degree by applying a low voltage to the virtual reference potential VSSM1, thereby enabling the time required to the power supply voltage VDD level to be largely shortened as compared with the recovery from the standby mode to the normal operation mode. Thus, recovery to the normal operation mode can be performed in shorter time.

For example, by lowering the power supply voltage VDD from about 1.2 V to about 1.0 V, power supply current IDD can be reduced more than power supply current IDD∂ (gate-source voltage-threshold voltage Vth) by 40% to 50% (saturation region).

When the power supply potential decreases, the frequency of a clock signal becomes lower, and the operation speed also decreases. Since it is expressed by power consumption P∂V² (power supply voltage)×f (clock frequency), the passing-through current in a CMOS or the like as a component of a logic in a region which enters the low-speed mode can be decreased, so that the power consumption can be reduced.

Although the case of individually driving the power switch 11 and the virtual reference potential VSSM1 has been described with reference to FIG. 5, for example, as shown in FIG. 6, the power switch 11 and the virtual reference potential VSSM1 may be driven in a mixed manner.

In this case, the power switch controller 6 has a configuration similar to, as an example, the configuration shown in FIG. 4 taking the countermeasure against inrush current. The power switch controller 6 is provided with an operational amplifier as the low-power drive circuit 9.

The virtual reference potential VSSM1 is obtained at the negative (−) side input terminal of the operational amplifier, and the reference voltage Vref is input to the positive (+) side input terminal of the operational amplifier. The logic unit 15 of the power switch controller 6 is coupled to the output part of the operational amplifier.

The output part of the operational amplifier 19 is coupled to, although not shown, the gate of the transistor as a component of the power switch 11, the other coupling part of each of the transistors 16 and 17, and one of the coupling parts of the transistor 18.

In FIG. 6, when the gate signal GATE of the power switch controller 6 is at the low level (power-off operation), for example, the low-power drive circuit 10 becomes active. When the enable signal EN1 becomes the low level, the level of the virtual reference potential VSSM1 becomes a low voltage (about 0.2V to 0.3V), and the operation in the region $2_1$ is set to a low speed (low-speed mode). When the enable signal EN1 becomes the high level, the virtual reference potential VSSM1 enters an open state.

At the recovery from the low-speed mode to the normal mode, the gate signal GATE becomes the high level (the recovery on operation), the enable signal EN1 becomes the high level, the low-power drive circuit 9 becomes inactive, and the power supplied to the virtual reference potential VSSM1 is interrupted.

An example of the region (function module) to which the low-power drive (low-speed mode) as the low-power-consumption control is applied is a region in which the high-speed and low-speed low-power operation is performed and the low-speed operation is possible, such as a CPU or a high-speed bus.

On the other hand, function modules which are not so suitable include a printer interface, a USB, a peripheral circuit such as a low-speed bus, or the like which has to operate at a constant speed in accordance with a protocol or the like. However, the invention is not limited to those modules.

FIG. 7 is a timing chart showing an operation example of the power shutdown control unit PC.

FIG. 7 shows signal timings of, from the top to the bottom, the enable signal EN1 output from the system controller 14, the request signal REQ output from the system controller 14, the gate signal GATE output from the power switch controller 6, and the virtual reference potential VSSM.

First, at the start up (period T1) of the semiconductor integrated circuit device 1, when the power switch 11 is turned on, first, the transistor 17 is turned on first to start the power switch 11 while suppressing the inrush current. After that, the transistor 16 is turned on so that the power switch 11 is fixed to the operation state with reliability.

After that, in a normal operation (period T2), the power supply voltage VDD becomes the highest (with full amplitude (VDD to VSS)). Subsequently, in the standby operation (period T0), the request signal REQ becomes the low level, and the power switch controller 6 turns off the power switch 11.

By the operation, no power is supplied to the region $2_1$, and a resting mode is obtained. At this time, the virtual reference potential VSSM becomes equal to the power supply voltage VDD. At the time of transition from the standby operation to the low-power operation (period T3) as a low-speed mode, the request signal REQ becomes the high level, and the enable signal EN1 output from the system controller 14 becomes the high level.

The low-power drive circuit 9 controls the virtual reference potential VSSM to, for example, about 0.2V to about 0.3V, thereby operating the region $2_1$ at low power as a low-speed mode.

According to the first embodiment, the low-power drive circuits 9 and 10 control the voltage level of the virtual reference potential VSSM, thereby enabling the voltage level of the power supply voltage VDD which is supplied to the regions $2_1$ and $2_3$. Consequently, finer low-power-consumption control can be realized.

As compared with the case of turning off the power switch 11, recovery to the normal operation can be performed at higher speed.

Second Embodiment

Figure 8:
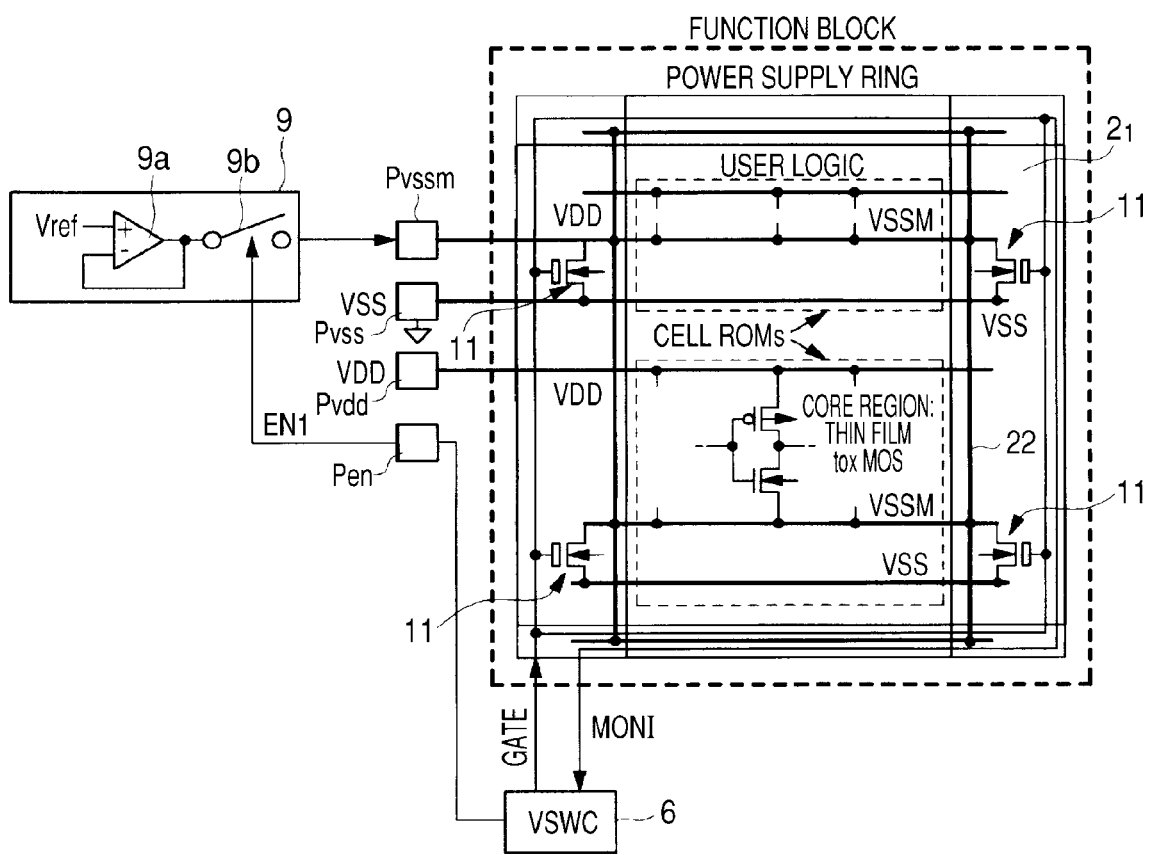
FIG. 8 is an explanatory diagram showing a configuration example of a semiconductor integrated circuit device according to a second embodiment of the invention.
Figure 9:
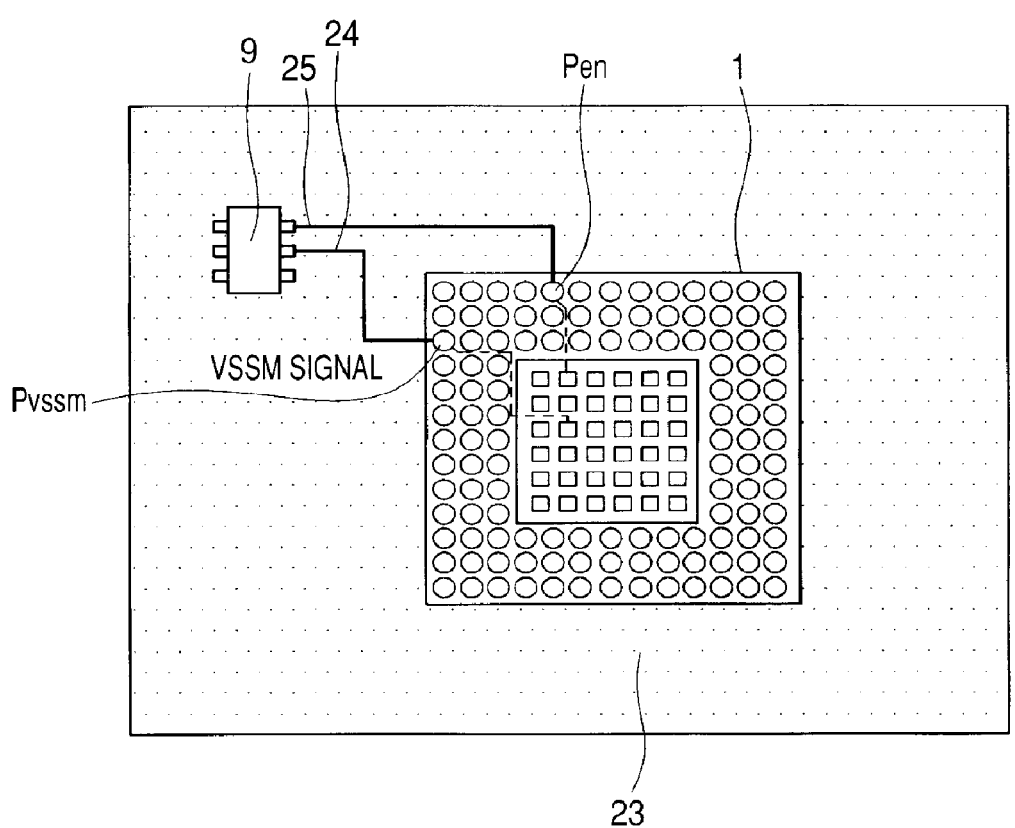
FIG. 9 is an explanatory diagram showing an image example of mounting the semiconductor integrated circuit device of FIG. 8 and a low-power drive circuit.

FIG. 8 is an explanatory diagram showing a configuration example of a semiconductor integrated circuit device according to second embodiment of the invention. FIG. 9 is an explanatory diagram showing an example of a mounting image of the semiconductor integrated circuit device of FIG. 8 and a low-power drive circuit.

The second embodiment relates to a configuration obtained by eliminating the low-power drive circuits 9 and 10 from the configuration of the semiconductor integrated circuit device 1 (FIG. 1) of the first embodiment. The low-power drive circuit 9 for varying the voltage of the virtual reference potential VSSM of the region $2_1$ is externally coupled to the semiconductor integrated circuit device 1.

As shown in FIG. 8, the semiconductor integrated circuit device 1 is provided with a power supply terminal Pvdd, a ground terminal Pvss, and a second ground terminal Pvssm. The low-power drive circuit 9 is coupled to a ring-shaped virtual reference potential wire 22 disposed in the region $2_1$ via the second ground terminal Pvssm.

The low-power drive circuit 9 is made of an amplifier 9a and a switch 9b, and the reference voltage Vref is input to the positive (+) side input terminal of the amplifier 9a. The output part of the amplifier 9a is coupled to the negative (−) side input terminal of the amplifier 9a.

The output part of the amplifier 9a is coupled to one of the coupling parts of the switch 9b, and the second ground terminal Pvssm is coupled to the other coupling part of the switch 9b. To the control terminal of the switch 9b, the enable signal EN1 is input via an enable terminal Pen as an external terminal.

The switch 9b performs on/off operation on the basis of the enable signal EN1 input to the control terminal, and controls to apply the voltage generated by the amplifier 9a to the virtual reference potential wire 22 via the second ground terminal Pvssm. The other configuration is similar to that of FIGS. 5 and 6 of the first embodiment.

Preferably, the low-power drive circuit 9 is disposed so as to eliminate the influence of wiring resistance in consideration of power noise for the reason that the virtual reference potential VSSM is controlled to be relatively low voltage. Preferably, the low-power drive circuit 9 is disposed close to the region $2_1$ as much as possible in consideration of a parasitic element.

Referring to FIG. 8, the case of varying the voltage of the virtual reference potential VSSM in the region $2_1$ has been described. In the case of also varying the voltage of the virtual reference potential VSSM in the region $2_3$ in a manner similar to the first embodiment, it is sufficient to newly provide the low-power drive circuit 10 (FIG. 1) and a second ground terminal and an enable terminal which are not shown to which the low-power drive circuit 10 is coupled.

FIG. 9 is an explanatory diagram showing an image example of mounting the semiconductor integrated circuit device 1 in FIG. 8 and the low-power drive circuit 9.

The semiconductor integrated circuit device 1 and the low-power drive circuit 9 made by a power IC and the like are mounted on a printed wiring board 23. An output terminal of the low-power drive circuit 9 and the second ground terminal Pvssm of the semiconductor integrated circuit device 1 are coupled to each other via a wire 24 formed on the printed wiring board 23.

The control terminal of the low-power drive circuit 9 and the enable terminal Pen of the semiconductor integrated circuit device 1 are coupled to each other via a wire 25 formed on the printed wiring board 23.

With the configuration, in the second embodiment, by providing the low-power drive circuit 9 on the outside of the semiconductor integrated circuit device 1, the power supply control on the virtual reference potential VSSM can be performed more stably, and the precision of the low-power-consumption control can be improved.

Third Embodiment

Figure 10:
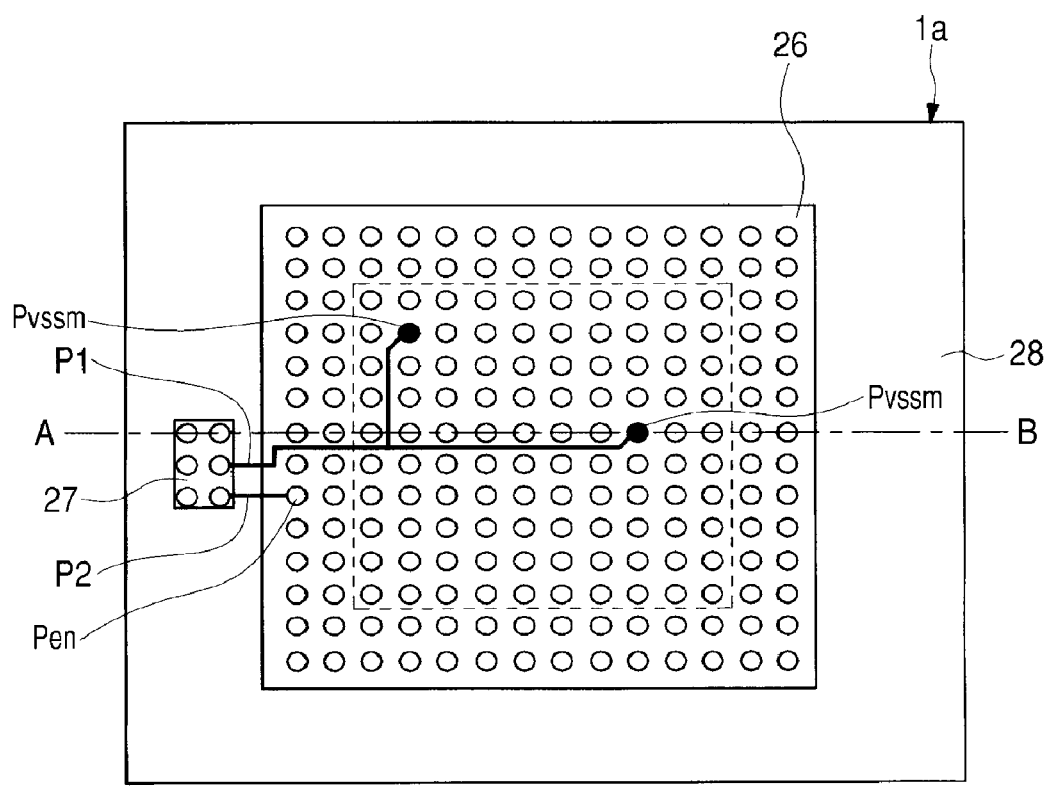
FIG. 10 is a top view of a semiconductor integrated circuit device according to a third embodiment of the invention.
Figure 11:
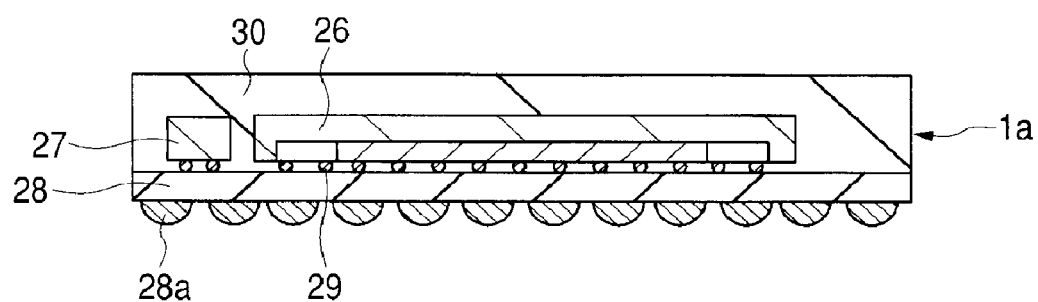
FIG. 11 is a cross section taken along A-B of FIG. 10.
Figure 12:
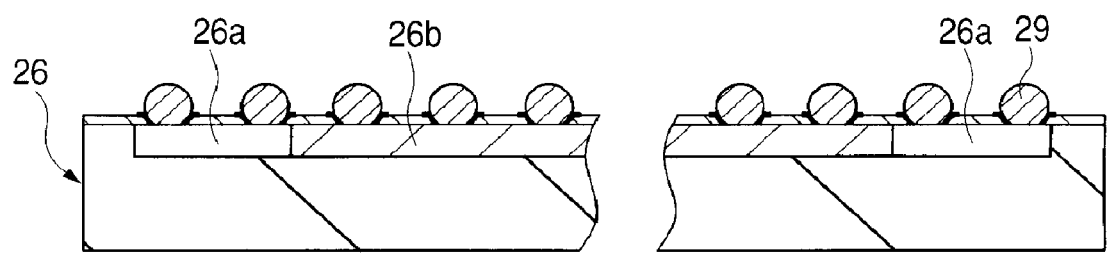
FIG. 12 is a cross section showing an example of a semiconductor chip provided for the semiconductor integrated circuit device of FIG. 10.

FIG. 10 is a top view of a semiconductor integrated circuit device according to a third embodiment of the invention. FIG. 11 is a cross section taken along A-B of FIG. 10. FIG. 12 is a cross section showing an example of a semiconductor chip provided for the semiconductor integrated circuit device of FIG. 10.

In the forgoing second embodiment, an example of coupling the low-power drive circuit 9 on the outside to the semiconductor integrated circuit device 1 has been described. In the third embodiment, an example of a semiconductor integrated circuit device 1a obtained by housing the low-power drive circuit 9 and the semiconductor integrated circuit device 1 in a single package will be described.

FIG. 10 is a top view of the semiconductor integrated circuit device 1a, and FIG. 11 is a cross section taken along A-B of FIG. 10.

The semiconductor integrated circuit device 1a is a system-in-package having the semiconductor chip 26 configuring the semiconductor integrated circuit device 1 and a semiconductor chip 27 configuring the low-power drive circuit 9 as shown in FIGS. 10 and 11.

The semiconductor integrated circuit device 1a has a mounting board 28. The semiconductor chip 26 is mounted in the center part of the mounting board 28, and the semiconductor chip 27 is mounted on the left side of the semiconductor chip 26.

A plurality of electrodes provided for the semiconductor chips 26 and 27 are coupled to corresponding electrodes formed on the main surface of the mounting board 28 via bumps 29. The electrodes formed on the main surface of the mounting board 28 are coupled to arbitrary external terminals 28a formed on the back side of the mounting board 28 via a wiring pattern, through holes, or the like formed in the mounting board 28.

The semiconductor chips 26 and 27 mounted on the mounting board 28 and the periphery of them are sealed by a sealing resin 30, thereby forming a package.

The semiconductor chip 26 is provided with two second ground terminals Pvssm. The two second ground terminals Pvssm and output terminals of the semiconductor chip 27 are coupled to each other via a wiring pattern P1 formed on the mounting board 28.

The enable terminal Pen of the semiconductor chip 26 and the input terminal of the enable signal EN1 of the semiconductor chip 27 are coupled to each other via a wiring pattern P2 formed on the mounting board 28.

FIG. 12 is a cross section showing an example of the semiconductor chip 26 provided for the semiconductor integrated circuit device 1a of FIG. 10.

In the semiconductor chip 26, as shown in the diagram, an I/O region 26a is formed in the peripheral portion on the main surface side of the semiconductor chip 26, and a core region 26b made by a logic circuit and the like is formed so as to be surrounded by the I/O region 26a. The plurality of bumps 29 disposed in an array are formed in the main surface of the semiconductor chip 26. The bumps 29 are, for example, solder bumps which are spherical solders or the like.

By forming the semiconductor integrated circuit device 1a and the low-power drive circuit 9 in a system-in-package configuration, the parasitic capacitance, parasitic resistance, or the like can be largely reduced in comparison with the case where the semiconductor integrated circuit device 1a and the low-power drive circuit 9 are coupled externally on the printed wiring board. Thus, higher-precision control on the virtual reference potential VSSM can be performed.

Therefore, in the third embodiment, by the semiconductor integrated circuit device 1a having the system-in-package configuration, efficient low-power-consumption control can be realized.

In addition, with the system-in-package configuration, the cost of parts can be reduced.

Fourth Embodiment

Figure 13:
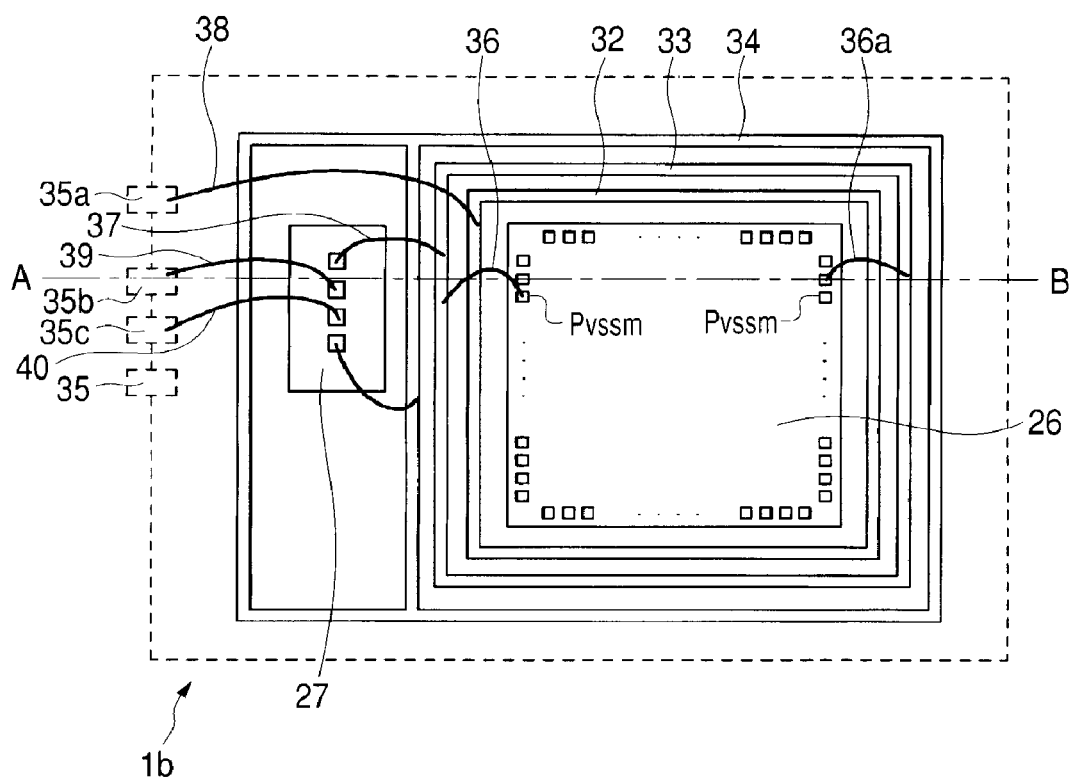
FIG. 13 is a top view of a semiconductor integrated circuit device according to a fourth embodiment of the invention.
Figure 14:
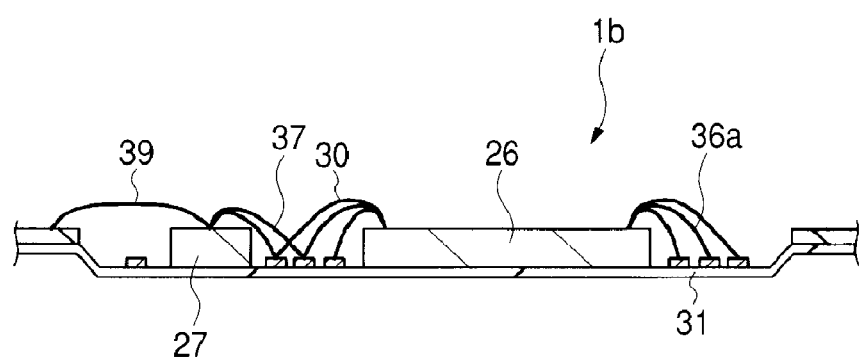
FIG. 14 is a cross section taken along line A-B of FIG. 13.

FIG. 13 is a top view of a semiconductor integrated circuit device according to a fourth embodiment of the invention. FIG. 14 is a cross section taken along line A-B of FIG. 13.

In the fourth embodiment, a technique of supplying the virtual reference potential VSSM will be described. Although the virtual reference potential VSSM is supplied via the wiring pattern P1 (FIG. 11) in the third embodiment, it may be also supplied by using a power supply bus.

FIG. 13 is a top view of a semiconductor integrated circuit device 1b, and FIG. 14 is a cross section taken along line A-B of FIG. 13. FIGS. 13 and 14 show a state where a package is formed.

The semiconductor integrated circuit device 1b is made by, for example, a QFP (Quad Flat Package), a QFN (Quad Flat Non-Leaded Package), or the like.

The semiconductor integrated circuit device 1b is formed as a system-in-package which is the same as that of the semiconductor integrated circuit device 1a (FIGS. 10 and 11) of the third embodiment provided with the semiconductor chip 26 and the semiconductor chip 27 configuring the low-power drive circuit 9. The semiconductor chip 26 is mounted on a base 31, and the semiconductor chip 27 is mounted on the left side of the semiconductor chip 26.

On the outer peripheral side of the semiconductor chip 26, a frame-shaped power supply bus 32 for supplying the power supply voltage VDD is formed. On the outer peripheral side of the power supply bus 32, a frame-shaped virtual reference potential bus 33 for supplying the virtual reference potential VSSM is formed. On the outer peripheral side of the virtual reference potential bus 33 and on the outer peripheral side of the semiconductor chip 27, a frame-shaped reference potential bus 34 for supplying the reference potential VSS is formed.

A plurality of leads 35 are formed in the outer peripheries of four sides of the base 31. The two second ground terminals Pvssm provided for the semiconductor chip 26 are coupled to the virtual reference potential bus 33 via bonding wires 36 and 36a in the shortest distance.

The virtual reference potential bus 33 is coupled to the output terminal of the semiconductor chip 27 via a bonding wire 37. The power supply bus 32 is coupled to a lead 35a via a bonding wire 38. In the plurality of leads 35, a lead 35b and a bonding wire 39 are assigned as power supply terminals, and the reference potential bus 34, a lead 35c, a bonding wire 40, and the semiconductor chip 27 are assigned as ground terminals.

The semiconductor chips 26 and 27, the power supply bus 32, the virtual reference potential bus 33, the reference potential bus 34, the bonding wires 36, 36a, 37 to 40, and the like are sealed with a resin, thereby forming a package.

As described above, by using the virtual reference potential bus 33, the virtual reference potential VSSM can be supplied from the position closest to the second ground terminal Pvssm of the semiconductor chip 26. Therefore, the virtual reference potential VSSM can be controlled stably.

Moreover, the wiring region for the virtual reference potential VSSM in the semiconductor chip 26 can be reduced, and the occupation area of the power supply wiring in the semiconductor chip 26 can be reduced.

Fifth Embodiment

Figure 15:
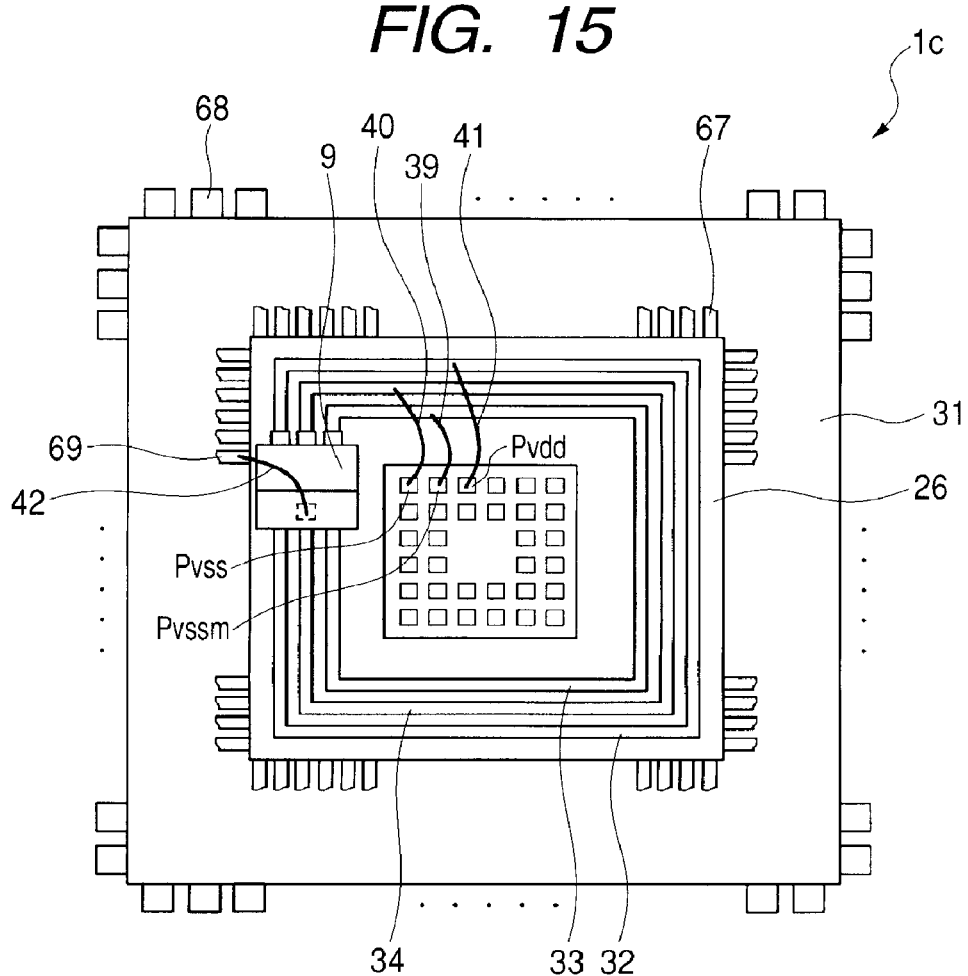
FIG. 15 is a top view showing a configuration example of a semiconductor integrated circuit device according to a fifth embodiment of the invention.
Figure 16:
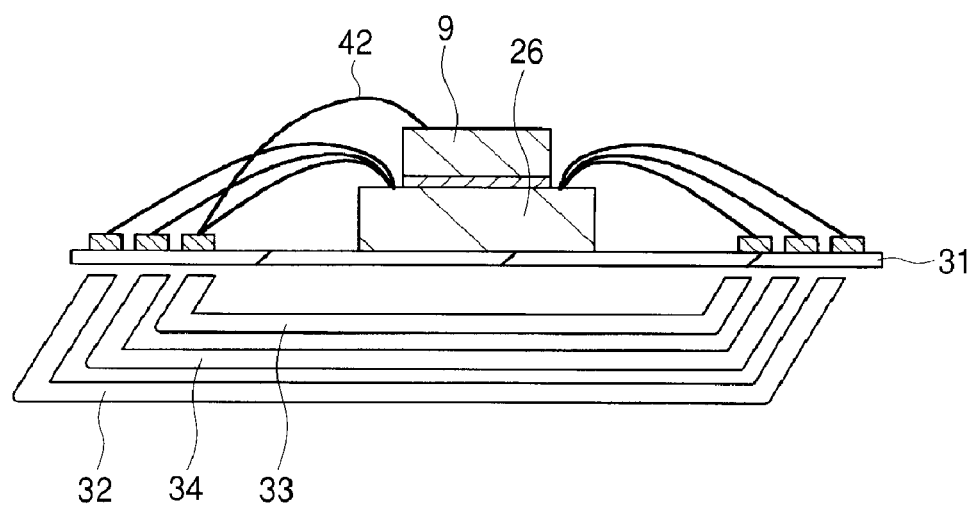
FIG. 16 is an explanatory diagram showing another configuration example of the semiconductor integrated circuit device according to the fifth embodiment of the invention.

FIG. 15 is a top view showing a configuration example of a semiconductor integrated circuit device according to a fifth embodiment of the invention. FIG. 16 is an explanatory diagram showing another configuration example of the semiconductor integrated circuit device according to the fifth embodiment of the invention.

In the fifth embodiment, a semiconductor integrated circuit device 1c is formed as a package such as a QFP or a QFN in a manner similar to the fourth embodiment except that the low-power drive circuit 9 is formed not by a semiconductor chip but a power-supply IC.

In this case, in the semiconductor integrated circuit device 1c, as shown in FIG. 15, the semiconductor chip 26 is mounted in the center portion of the base 31. In the peripheral portion of the semiconductor chip 26, and the frame-shaped virtual reference potential bus 33 is formed so as to surround the semiconductor chip 26.

In the peripheral portion of the virtual reference potential bus 33, the frame-shaped reference potential bus 34 is formed so as to surround the virtual reference potential bus 33. In the peripheral portion of the reference potential bus 34, the frame-shaped power supply bus 32 is formed so as to surround the reference potential bus 34.

A plurality of electrodes are formed in an array on the top face of the semiconductor chip 26. A plurality of inner leads 67 are formed. The inner leads 67 extend from the package and become outer leads 68.

External terminals of the low-power drive circuit 9 formed as a power supply IC are coupled to the virtual reference potential bus 33, the reference potential bus 34, and the power supply bus 32. The virtual reference potential bus 33 is coupled to the second ground terminal Pvssm of the semiconductor chip 26 via the bonding wire 39, and the reference potential bus 34 is coupled to the ground terminal Pvss of the semiconductor chip 26 via the bonding wire 40.

Further, the power supply bus 32 is coupled to the power supply terminal Pvdd of the semiconductor chip 26 via a bonding wire 41. An inner lead 69 for power supply is coupled to the power supply part of the low-power drive circuit 9 via a bonding wire 42, so that the power supply voltage VCC is supplied to the low-power drive circuit 9. Although not shown, another electrode part of the semiconductor chip 26 and an arbitrary inner lead 67 are also coupled to each other via a bonding wire.

As described above, by disposing the low-power drive circuit 9 as a power supply IC for the virtual reference potential bus 33, the reference potential bus 34, and the power supply bus 32, a space above the buses can be effectively utilized, and the semiconductor integrated circuit device 1c can be miniaturized.

The low-power drive circuit 9 as a power supply IC may not be disposed above the buses but may be mounted on the semiconductor chip 26 as shown in FIG. 16. In this case, the virtual reference potential VSSM is coupled to the virtual reference potential bus 33 via the bonding wire 42.

With the configuration, the semiconductor integrated circuit device 1c can be further miniaturized.

Sixth Embodiment

Figure 17:
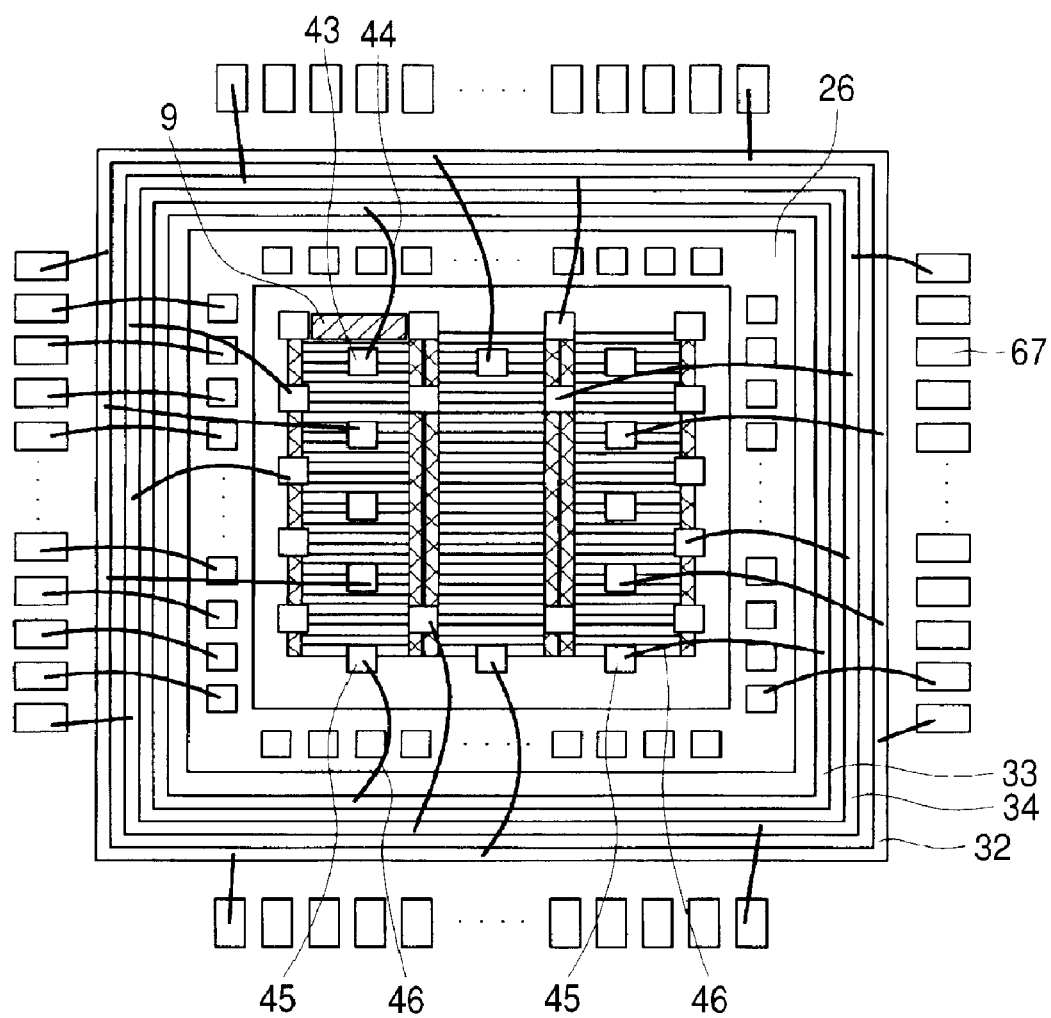
FIG. 17 is an explanatory diagram showing a configuration example of a semiconductor integrated circuit device according to a sixth embodiment of the invention.

FIG. 17 is an explanatory diagram showing a configuration example of a semiconductor integrated circuit device according to a sixth embodiment of the invention.

In the sixth embodiment, a technique of supplying power to the virtual reference potential bus 33 in the case where the low-power drive circuit 9 is provided in the same chip as shown in the first embodiment will be described. It is assumed that the package form is a QFP, QFN, or the like in a manner similar to the foregoing fourth and fifth embodiments.

In this case, on the outer peripheral side of the semiconductor chip 26, the frame-shaped virtual reference potential bus 33 is formed so as to surround the semiconductor chip 26 as shown in FIG. 17. On the outer peripheral side of the virtual reference potential bus 33, the frame-shaped reference potential bus 34 is formed so as to surround the virtual reference potential bus 33.

On the outer peripheral side of the reference potential bus 34, the frame-shaped power supply bus 32 is formed so as to surround the reference potential bus 34. On the outer peripheral side of the power supply bus 32, the plurality of inner leads 67 are formed.

The low-power drive circuit 9 is disposed in an upper left part of the semiconductor chip 26. Below the low-power drive circuit 9, electrodes 43 for outputting the virtual reference potential VSSM output from the low-power drive circuit 9 are formed from an upper part to a lower part of the semiconductor chip 26.

The electrode 43 is coupled to the virtual reference potential bus 33 via a bonding wire 44. An electrode 45 to which the virtual reference potential VSSM is input is formed below the semiconductor chip 26.

The electrode 45 is coupled to the virtual reference potential bus 33 via a bonding wire 46. Therefore, the virtual reference potential VSSM output from the low-power drive circuit 9 is supplied via the electrode 43, the bonding wire 44, the virtual reference potential bus 33, the electrode 45, and the bonding wire 46.

In this case as well, by forming the virtual reference potential bus 33 in the outer peripheral part of the semiconductor chip 26, the virtual reference potential VSS can be efficiently supplied to an arbitrary region which is desired to be controlled in the low-speed mode.

Seventh Embodiment

Figure 18:
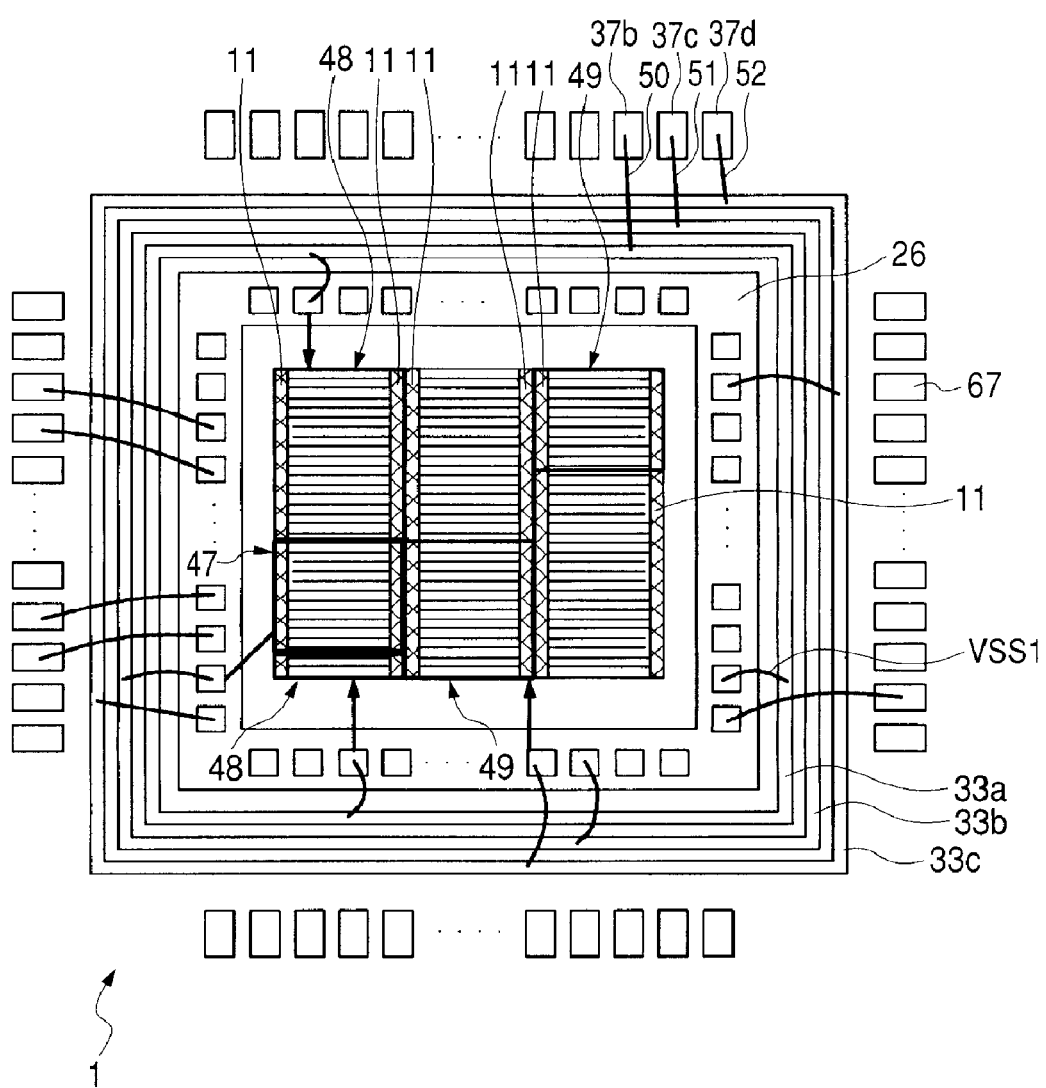
FIG. 18 is an explanatory diagram showing a configuration example of a semiconductor integrated circuit device according to a seventh embodiment of the invention.

FIG. 18 is an explanatory diagram showing a configuration example of a semiconductor integrated circuit device according to a seventh embodiment of the invention.

In the seventh embodiment, a technique of supplying power via the virtual reference potential bus 33 in the case where there are a plurality of regions which are desired to be controlled in the low-speed mode will be described.

It is assumed here that, for example, there are three regions 47 to 49 which are desired to be controlled in the low-speed mode. In this case, as shown in FIG. 18, on the outer peripheral side of the semiconductor chip 26, a frame-shaped virtual reference potential bus 33a is formed so as to surround the semiconductor chip 26. On the outer peripheral side of the virtual reference potential bus 33a, a frame-shaped virtual reference potential bus 33b is formed so as to surround the virtual reference potential bus 33a. On the outer peripheral side of the virtual reference potential bus 33b, a frame-shaped virtual reference potential bus 33c is formed so as to surround the virtual reference potential bus 33b.

The virtual reference potential bus 33a supplies a virtual reference potential VSSM1 to the region 48. The virtual reference potential bus 33b supplies a virtual reference potential VSSM2 to the region 47. The virtual reference bus 33c supplies a virtual reference potential VSSM3 to the region 49. On both sides of each of the regions 47 to 49, the power switches 11 are formed.

In FIG. 18, in the semiconductor integrated circuit device 1, it is assumed that the virtual reference potentials VSSM1 to VSSM3 are supplied from the outside like in the case of FIG. 9. For example, power is supplied to the virtual reference potential buses 33a to 33c from the inner leads 37b to 37d via bonding wires 50 to 52.

By supplying the virtual reference potentials VSSM1 to VSSM3 from the outside, after the package is sealed, the levels of the virtual reference potentials VSSM1 to VSSM3 can be easily arbitrarily controlled.

Eighth Embodiment

Figure 19:
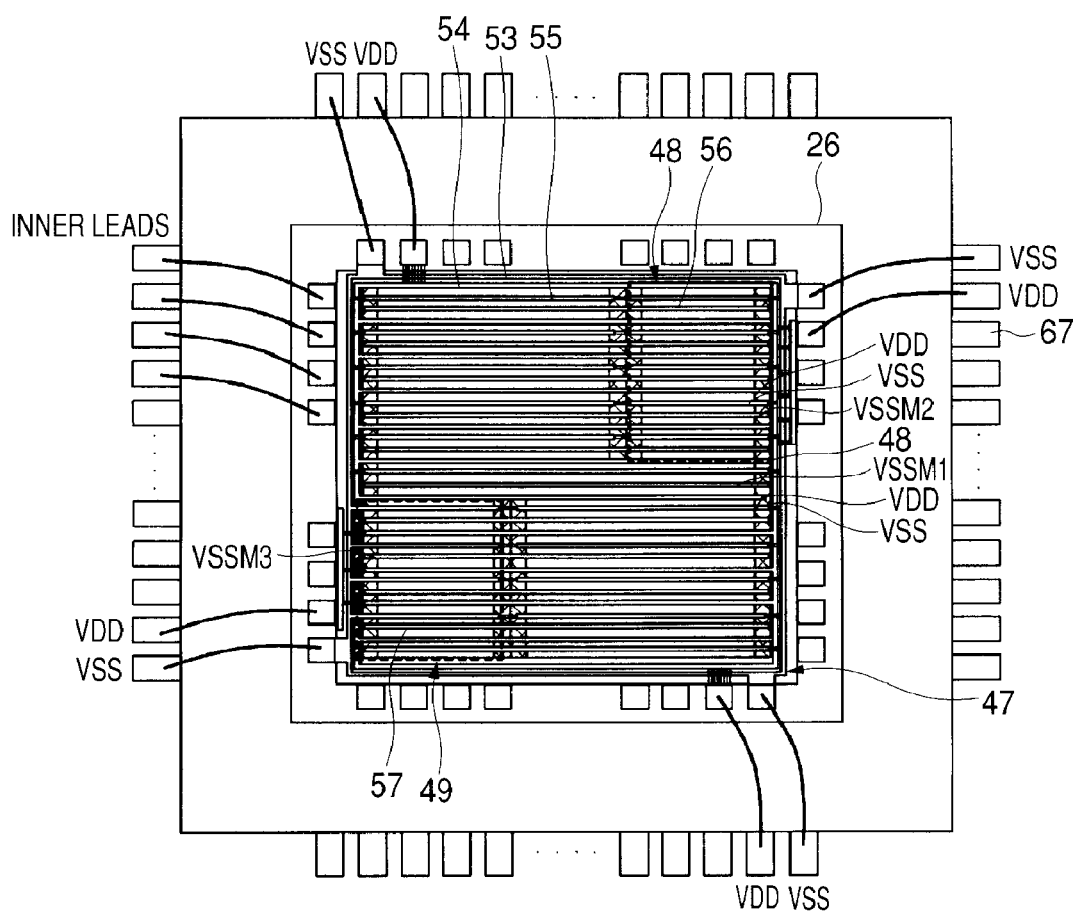
FIG. 19 is an explanatory diagram showing an example of power feeding wires used for virtual reference potentials of a semiconductor chip provided for a semiconductor device according to an eighth embodiment of the invention.

FIG. 19 is an explanatory diagram showing an example of power feeding wires used for virtual reference potentials of a semiconductor chip provided for a semiconductor device according to an eighth embodiment of the invention.

In the eighth embodiment, wires for feeding the virtual reference potentials VSSM1 to VSSM3 in the semiconductor chip 26 will be described.

FIG. 19 is an explanatory diagram showing a layout example of highest-order metal wires of the semiconductor chip 26.

From the left side to the right side of the semiconductor chip 26, a plurality of linear wires 53 and 54 are formed at equal intervals. The wires 53 are wires for the reference potential VSS, and the wires 54 are wires for the power supply voltage VDD.

In an upper part of the region 47, wires 55 as wires for the virtual reference potential VSSM1 are formed at equal intervals from the left side to the right side of the region 47. In an upper part of the region 48, wires 56 as wires for the virtual reference potential VSSM2 are formed at equal intervals from the left side to the right side of the region 48. In an upper part of the region 49, wires 57 as wires for the virtual reference potential VSSM3 are formed at equal intervals from the left side to the right side of the region 49.

As described above, without separating the wires 53 and 54 as trunk lines for feeding the power supply voltage, only the wires 55 to 57 for the virtual reference potential VSSM3 are separated in the regions 47 to 49. With the configuration, the layout area can be reduced.

Ninth Embodiment

Figure 20:
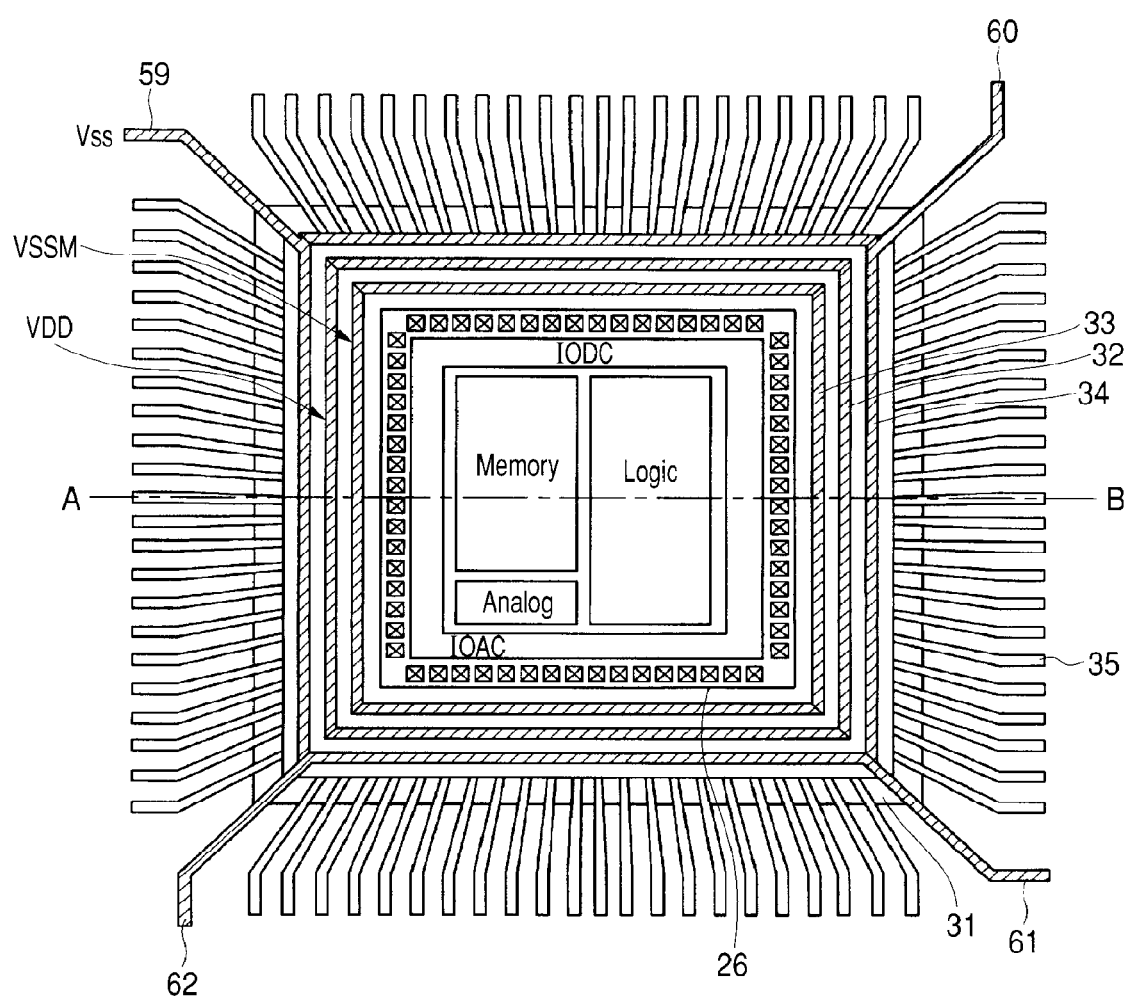
FIG. 20 is an explanatory diagram showing a formation example of outer leads provided for a semiconductor integrated circuit device according to a ninth embodiment of the invention.
Figure 21:
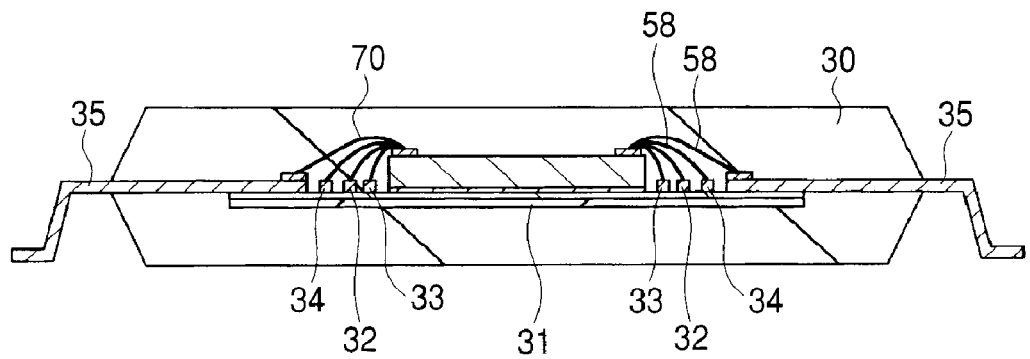
FIG. 21 is across section of the semiconductor integrated circuit device according to the ninth embodiment of the invention.

FIG. 20 is an explanatory diagram showing a formation example of outer leads provided for a semiconductor integrated circuit device according to a ninth embodiment of the invention. FIG. 21 is a cross section of the semiconductor integrated circuit device according to the ninth embodiment of the invention.

In the ninth embodiment, an example of the case of forming the reference potential bus 34 as an outer lead will be described.

In this case, as shown in FIGS. 20 and 21, the semiconductor chip 26 is mounted in the center portion of the base 31. In the base 31, in the outer peripheral portion of the semiconductor chip 26, the frame-shaped virtual reference potential bus 33 is formed so as to surround the semiconductor chip 26.

On the outer peripheral side of the virtual reference potential bus 33, the frame-shaped power supply bus 32 is formed so as to surround the virtual reference potential bus 33. Similarly, on the outer peripheral side of the power supply bus 32, the frame-shaped reference potential bus 34 is formed.

A plurality of electrodes are formed in the peripheral portion of the semiconductor chip 26. Arbitrary electrodes and the virtual reference potential bus 33, the power supply bus 32, and the reference potential bus 34 formed in the base 31 near the outer periphery of the semiconductor chip 26 are coupled to each other via bonding wires 58.

The other electrodes of the semiconductor chip 26 are coupled to via the leads 35 and bonding wires 70 provided in the periphery of the reference potential bus 34. Four corners of the reference potential bus 34 extend to form leads 59 to 62.

The base 31, the semiconductor chip 26, the virtual reference potential bus 33, the power supply bus 32, the reference potential bus 34, the lead 35, the leads 59 to 62, the bonding wires 58 and 70, and the like are sealed with the sealing resin 30, thereby forming a package.

The virtual reference potential bus 33, the power supply bus 32, and the reference potential bus 34 are adhered by, for example, a tape, a heat splitter adhesive, or the like.

Tenth Embodiment

Figure 22:
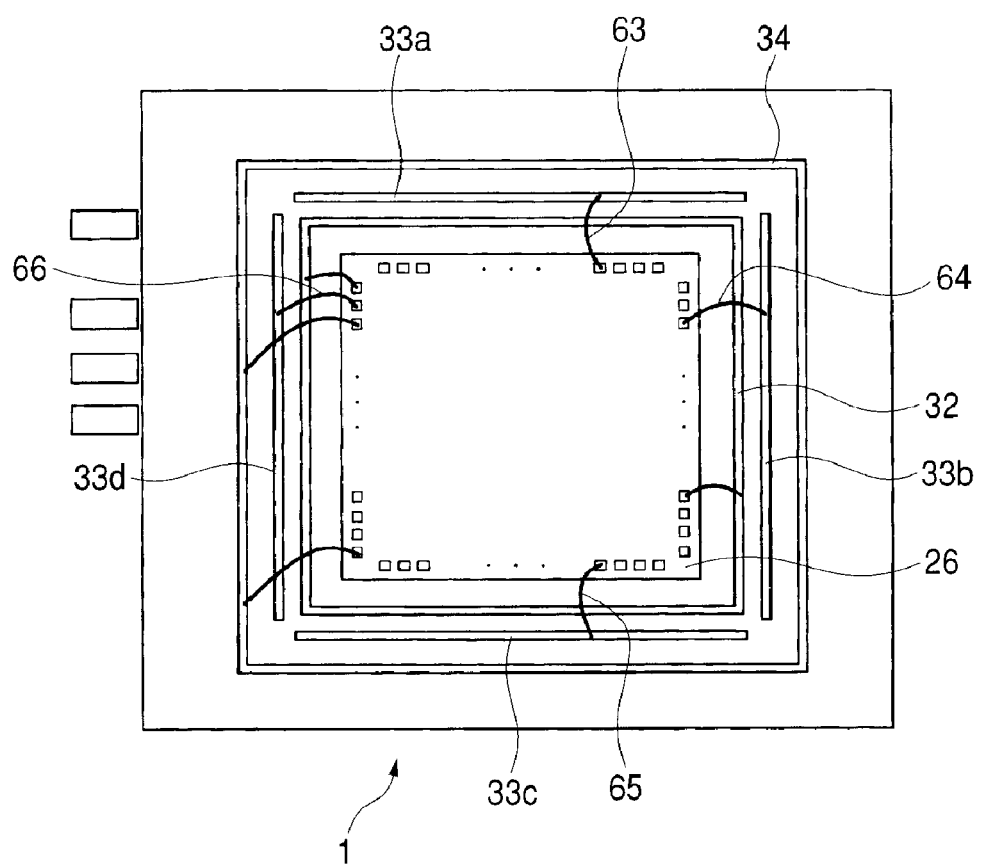
FIG. 22 is an explanatory diagram showing an example of a virtual reference potential bus provided for the semiconductor integrated circuit device according to a tenth embodiment of the invention.

FIG. 22 is an explanatory diagram showing an example of a virtual reference potential bus provided for a semiconductor integrated circuit device according to a tenth embodiment of the invention.

In the foregoing seventh embodiment (FIG. 18), the technique of supplying power via the three frame-shaped virtual reference potential buses 33 has been described. In the tenth embodiment, as a modification of the seventh embodiment, a technique of supplying power via a frame-shaped reference potential bus 33 which is divided will be described.

In this case, as shown in FIG. 22, on the outer peripheral side of the semiconductor chip 26, the frame-shaped power supply bus 32 is formed so as to surround the semiconductor chip 26. On the outer peripheral side of the power supply bus 32, the frame-shaped reference potential bus 34 is formed.

Between the upper side of the power supply bus 32 and the upper side of the reference potential bus 34, a linear-shaped virtual reference potential bus 33a is formed. Between the right side of the power supply bus 32 and the right side of the reference potential bus 34, a linear-shaped virtual reference potential bus 33b is formed. Between the lower side of the power supply bus 32 and the lower side of the reference potential bus 34, a linear-shaped virtual reference potential bus 33c is formed. Further, between the left side of the power supply bus 32 and the left side of the reference potential bus 34, a linear-shaped virtual reference potential bus 33d is formed.

The virtual reference potential buses 33a to 33d supply the virtual reference potentials VSSM1 to VSSM4 to the four second ground terminals Pvssm provided for the semiconductor chip 26 via bonding wires 63 to 66.

By dividing the virtual reference potential bus to arbitrary number of pieces as described above, even if the kinds of virtual reference potentials increase, they can be handled. Even when the number of regions on which the low-power consumption is controlled increases, high-precision low-power consumption control can be performed.

The present invention achieved by the inventors herein has been concretely described above on the basis of the embodiments. Obviously, the present invention is not limited to the foregoing embodiments but can be variously modified without departing from the gist.

The present invention is suitably applied to a semiconductor integrated circuit device in which the low-power consumption control is performed every power supply region in which one or more function modules are disposed.

What is claimed is:

1. A semiconductor integrated circuit device comprising:
   a first power wire to receive a power supply voltage;
   a second power wire to receive a reference voltage;
   a third power wire to receive a reference potential;
   a power supply switch to connect the second power wire and the third power wire;
   a power region coupled between the first and second power wires and controllable to operate in different low-power consumption modes, including a low-speed mode and a standby mode;
   a reference voltage regulator to supply the reference voltage to the second power wire;
   a power switch control unit to control the power supply switch based on a connection control signal; and
   a power consumption control unit to determine an operation state of the power region and to control the reference voltage regulator and the power switch control unit,
   wherein, in the low-speed mode, the power consumption control unit controls the reference voltage regulator to supply the reference voltage to the second power wire and controls the power switch control unit to turn off the power supply switch so as to make the power region operating in the low-speed mode operate between the power supply voltage and the reference voltage, wherein, in the standby mode, the power consumption control unit stops operation of the reference voltage regulator, and controls the power switch control unit to turn off the power supply switch to interrupt supply of the reference voltage and the reference potential to the power region operating in the standby mode, and wherein, in a normal operation mode, the power consumption control unit stops operation of the reference voltage regulator, controls the power switch control unit to turn on the power supply switch, and makes the power region operating in the normal operation mode operate between the power supply voltage and the reference potential.

2. The semiconductor integrated circuit device according to claim 1, wherein the semiconductor integrated circuit device has a system-in-package configuration in which at least two semiconductor chips are mounted, and the reference voltage regulator is comprised of one of the at least two semiconductor chips.

3. The semiconductor integrated circuit device according to claim 1, wherein the reference voltage generated by the reference voltage regulator is supplied to the second power wire via a power bus formed on the outside of a semiconductor chip.

4. The semiconductor integrated circuit device according to claim 2, wherein the reference voltage generated by the reference voltage regulator is supplied to the second power wire via a power bus formed on the outside of a semiconductor chip.

5. A semiconductor integrated circuit device comprising:
a first power wire to receive a power supply voltage;
a second power wire to receive a reference voltage;
a third power wire to receive a reference potential;
a power supply switch to connect the second power wire and the third power wire;
a power region coupled between the first and second power wires and controllable to operate in different low-power consumption modes, including a low-speed mode and a standby mode;
a reference voltage regulator to supply the reference voltage to the second power wire;
a power switch control unit to control the power supply switch based on a connection control signal; and
a power consumption control unit to determine an operation state of the power region and to control the reference voltage regulator and the power switch control unit,
wherein, in the low-speed mode, the power consumption control unit controls the reference voltage regulator to control a gate of a power switch to supply the reference voltage to the second power wire, controls the power switch control unit to turn off the power supply switch, and to make the power region operating in the low-speed mode operate between the power supply voltage and the reference voltage,
wherein, in the standby mode, the power consumption control unit stops operation of the reference voltage regulator, controls the power switch control unit to turn off the power supply switch, and interrupts supply of the reference voltage and the reference potential to the power region operating in the standby mode, and
wherein, in a normal operation mode, the power consumption control unit stops operation of the reference voltage regulator, controls the power switch control unit to turn on the power supply switch, and makes the power region operating in the normal operation mode operate between the power supply voltage and the reference potential.

6. The semiconductor integrated circuit device according to claim 5, wherein the semiconductor integrated circuit device has a system-in-package configuration in which at least two semiconductor chips are mounted, and the reference voltage regulator is comprised of one of the at least two semiconductor chips.

7. The semiconductor integrated circuit device according to claim 6, wherein the reference voltage generated by the reference voltage regulator is supplied to the second power wire via a power bus formed on the outside of a semiconductor chip.

8. The semiconductor integrated circuit device according to claim 5, wherein the reference voltage generated by the reference voltage regulator is supplied to the second power wire via a power bus formed on the outside of a semiconductor chip.

9. A semiconductor integrated circuit device comprising:
a first power wire to receive a power supply voltage;
a second power wire to receive a reference voltage;
a third power wire to receive a reference potential;
a power supply switch to connect the second power wire and the third power wire;
a power region coupled between the first and second power wires and controllable to operate in different low-power-consumption modes, including a low-speed mode and a standby mode;
a power switch control unit to control the power supply switch based on a connection control signal; and
a power consumption control unit to determine an operation state of the power region and to control the power switch control unit and an externally coupled reference voltage regulator to supply the reference voltage to the second power wire,
wherein, in the low-speed mode, the power consumption control unit controls the reference voltage regulator to supply the reference voltage to the second power wire, controls the power switch control unit to turn off the power supply switch, and to make the power region operating in the low-speed mode operate between the power supply voltage and the reference voltage,
wherein, in the standby mode, the power consumption control unit stops operation of the reference voltage regulator, controls the power switch control unit to turn off the power supply switch, and interrupts supply of the reference voltage and the reference potential to the power region operating in the standby mode, and
wherein, in a normal operation mode, the power consumption control unit stops operation of the reference voltage regulator, controls the power switch control unit to turn on the power supply switch, and makes the power region operating in the normal operation mode operate between the power supply voltage and the reference potential.

10. The semiconductor integrated circuit device according to claim 9, wherein the reference voltage generated by the reference voltage regulator is supplied to the second power wire via a power bus formed on the outside of a semiconductor chip.

11. A semiconductor integrated circuit device comprising:
a first power wire to receive a power supply voltage;
a second power wire to receive a reference voltage;
a third power wire to receive a reference potential;
a power supply switch to connect the second power wire and the third power wire;
a power region coupled between the first and second power wires and controllable in different low-power consumption modes, including a low-speed mode and a standby mode;
a power switch control unit to control the power supply switch based on a connection control signal; and a power consumption control unit to determine an operation state of the power region and to control the power switch control unit and an externally coupled reference voltage regulator to supply the reference voltage to the second power wire, wherein, in the low-speed mode, the power consumption control unit controls the reference voltage regulator to control a gate of a power switch, controls the reference voltage supplied to the second power wire, controls the power switch control unit to turn off the power supply switch, and makes the power region operating in the low-speed mode operate between the power supply voltage and the reference voltage, wherein, in the standby mode, the power consumption control unit stops operation of the reference voltage regulator, controls the power switch control unit to turn off the power supply switch, and interrupts supply of the reference voltage and the reference potential to the power region operating in the standby mode, and wherein, in a normal operation mode, the power consumption control unit stops operation of the reference voltage regulator, controls the power switch control unit to turn on the power supply switch turned on, and makes the power region operating in the normal operation mode operate between the power supply voltage and the reference potential.

12. The semiconductor integrated circuit device according to claim 11, wherein the semiconductor integrated circuit device has a system-in-package configuration in which at least two semiconductor chips are mounted, and the reference voltage regulator is comprised of one of the at least two semiconductor chips.

13. The semiconductor integrated circuit device according to claim 12, wherein the reference voltage generated by the reference voltage regulator is supplied to the second power wire via a power bus formed on the outside of a semiconductor chip.

14. The semiconductor integrated circuit device according to claim 11, wherein the reference voltage generated by the reference voltage regulator is supplied to the second power wire via a power bus formed on the outside of a semiconductor chip.

15. The semiconductor integrated circuit device according to claim 11,
wherein the power switch control unit includes a logic unit to generate a switch control signal based on a control signal output from the power consumption control unit, and an inverter unit to generate a drive control signal for controlling operation of a switch unit based on the switch control signal output from the logic unit,
wherein the inverter unit includes a first P-channel MOS transistor to drive a high power, a second P-channel MOS transistor to drive a low power, and a N-channel MOS transistor, the first and second P-channel MOS transistors being coupled in parallel to each other and being coupled to the N-channel MOS transistor in series, and
wherein, when the power consumption control unit outputs a reset control signal to reset the mode from the standby mode to the normal operation mode, the logic unit performs a control of driving the second P-channel MOS transistor for an arbitrary period, and, after that, driving the first P-channel MOS transistor.

16. The semiconductor integrated circuit device according to claim 15, wherein the reference voltage generated by the reference voltage regulator is supplied to the second power wire via a power bus formed on the outside of a semiconductor chip.

\* \* \* \* \*